US012799593B2

(12) United States Patent
Connell et al.

(10) Patent No.: US 12,799,593 B2
(45) Date of Patent: Nov. 17, 2026

(54) MULTIFUNCTIONAL COATINGS FOR SOLID STATE ELECTROLYTE POWDERS

(71) Applicant: UCHICAGO ARGONNE, LLC, Chicago, IL (US)

(72) Inventors: Justin Grant Connell, Chicago, IL (US); Jeffrey W. Elam, Elmhurst, IL (US); Zachary David Hood, Bolingbrook, IL (US); Anil U. Mane, Naperville, IL (US); Peter Zapol, Hinsdale, IL (US); Aditya Sundar, Westmont, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 191 days.

(21) Appl. No.: 18/514,980

(22) Filed: Nov. 20, 2023

(65) Prior Publication Data

US 2025/0163575 A1 May 22, 2025

(51) Int. Cl.
*C23C 16/455* (2006.01)
*C23C 16/30* (2006.01)
*H01M 10/0562* (2010.01)

(52) U.S. Cl.
CPC ...... *C23C 16/45529* (2013.01); *C23C 16/305* (2013.01); *C23C 16/45553* (2013.01); *H01M 10/0562* (2013.01); *H01M 2300/008* (2013.01)

(58) Field of Classification Search
CPC ................................................ C23C 16/45529
See application file for complete search history.

(56) References Cited

U.S. PATENT DOCUMENTS

| | | | | |
|---|---|---|---|---|
| 2016/0351973 | A1* | 12/2016 | Albano ................. | H01M 4/628 |
| 2016/0358835 | A1* | 12/2016 | Xie ........................ | H10D 62/83 |
| 2020/0075960 | A1 | 3/2020 | Wachsman et al. | |
| 2020/0403267 | A1* | 12/2020 | Li ......................... | H01M 4/131 |

OTHER PUBLICATIONS

Adeli, et al., "Boosting Solid-State Diffusivity and Conductivity in Lithium Superionic Argyrodites by Halide Substitution," Angewandte Chemie 131(26), pp. 8773-8778 (2019).

Albertus, et al., "Challenges for and Pathways toward Li-Metal-Based All-Solid-State Batteries," ACS Energy Letters 6(4), pp. 1399-1404 (2021).

(Continued)

*Primary Examiner* — Robert A Vetere
(74) *Attorney, Agent, or Firm* — Foley & Lardner LLP

(57) ABSTRACT

A method for forming lithium argyrodite composite powders includes providing within an atomic layer deposition (ALD) reactor lithium argyrodite powders of formula $Li_{7-x}BCh_{6-x}X_x$, where 0<x<1, B is phosphorous or arsenic, Ch is sulfur or selenium, and X is F, Cl, Br, I, or a mixture of any two or more thereof; and depositing a coating on the lithium argyrodite powders by an ALD process to form coated lithium argyrodite powders. The method of depositing the coating includes (A) introducing a first precursor gas into the ALD reactor to form first precursor complexes on surfaces of the lithium argyrodite powders; and (B) introducing a first co-reactant into the ALD reactor, the first co-reactant reactive with the first precursor complexes.

16 Claims, 16 Drawing Sheets

(56) References Cited

OTHER PUBLICATIONS

Auvergniot, et al., "Interface Stability of Argyrodite Li6PS5Cl toward LiCoO2, LiNi1/3Co1/3Mn1/3O2, and LiMn2O4 in Bulk All-Solid-State Batteries," Chemistry of Materials 29(9), pp. 3883-3890 (2017).
Banik, et al., "On the underestimated influence of synthetic conditions in solid ionic conductors," Chemical Science 12(18), pp. 6238-6263 (2021).
Chen, et al., "Lithium metal protected by atomic layer deposition metal oxide for high performance anodes," Journal of Materials Chemistry A 5(24), pp. 12297-12309 (2017).
Chen, et al., "Sustained Release-Driven Formation of Ultrastable SEI between Li6PS5Cl and Lithium Anode for Sulfide-Based Solid-State Batteries," Advanced Energy Materials 11(4):2002545, 11 pages (2020).
Darapaneni, et al., "Removal of Surface Carbonate from Lithium-Ion Battery Cathode Materials via Vapor-Phase Fluorination," ACS Applied Energy Materials 5(8), pp. 9870-9876 (2022) (25 page accepted manuscript provided).
Han, et al., "Negating interfacial impedance in garnet-based solid-state Li metal batteries," Nature Materials 16, pp. 572-579 (2017) (advanced online publication provided; 9 pages).
Hitz, "Ion-Conducting, Electron-Blocking Layer for High-Performance Solid Electrolytes," Small Structures 2(8):2100014, 9 pages (2021).
Hitz, et al., "High-rate lithium cycling in a scalable trilayer Li-garnet-electrolyte architecture," Materials Today 22, pp. 50-57 (2019) (8 page accepted manuscript provided).
Hood, et al., "Multifunctional Coatings on Sulfide-Based Solid Electrolyte Powders with Enhanced Processability, Stability, and Performance for Solid-State Batteries," Advanced Materials 35(21):2300673, 8 pages (2023).
Janek & Zeier, "A solid future for battery development," Nature Energy 1:16141, 4 pages (2016).
Jung, et al., "Functionalized Sulfide Solid Electrolyte with Air-Stable and Chemical-Resistant Oxysulfide Nanolayer for All-Solid-State Batteries," ACS Omega 5(40), pp. 26015-26022 (2020).
Jung, et al., "Ultrathin Direct Atomic Layer Deposition on Composite Electrodes for Highly Durable and Safe Li-Ion Batteries," Advanced Materials 22(19), pp. 2172-2176 (2010).
Kang, et al., "Modification of LiMn2O4 surfaces by controlling the Acid-base surface chemistry of atomic layer deposition," Applied Surface Science 599:153329 (2022) (25 page accepted manuscript provided).
Kozen, et al., "Next-Generation Lithium Metal Anode Engineering via Atomic Layer Deposition," ACS Nano 9(6), pp. 5884-5892 (2015).
Kraft, et al., "Influence of Lattice Polarizability on the Ionic Conductivity in the Lithium Superionic Argyrodites Li6PS5X (X=Cl, Br, I)," Journal of the American Chemical Society 139(31), pp. 10909-10918 (2017).
Lee, et al., "Powder Coatings via Atomic Layer Deposition for Batteries: A Review," Chemistry of Materials 34(8), pp. 3539-3587 (2022).
Liang, et al., "Stabilizing and understanding the interface between nickel-rich cathode and PEO-based electrolyte by lithium niobium oxide coating for high-performance all-solid-state batteries," Nano Engergy 78:105107 (2020) (24 page accepted manuscript provided).
Lipson, et al., "Nanoscale Investigation of Solid Electrolyte Interphase Inhibition on Li-Ion Battery MnO Electrodes via Atomic Layer Deposition of Al2O3," Chemistry of Materials 26(2), pp. 935-940 (2014).
Liu, et al., "Pathways for practical high-energy long-cycling lithium metal batteries," Nature Energy 4, pp. 180-186 (2019).
Mo, et al., "LiAl5O8 as a potential coating material in lithium-ion batteries: a first principles study," Physical Chemistry Chemical Physics 21(25), pp. 13758-13765 (2019).
Nikodimos, et al., "Chemical stability of sulfide solid-state electrolytes: stability toward humid air and compatibility with solvents and binders," Energy & Environmental Science 15(3), pp. 991-1033 (2022).
Rajagopal, et al., "Rapid Synthesis of Highly Conductive Li6PS5Cl Argyrodite-Type Solid Electrolytes Using Pyridine Solvent," ACS Applied Energy Materials 5(8), pp. 9266-9272 (2022).
Ren & Wachsman, "All Solid-State Li/LLZO/LCO Battery Enabled by Alumina Interfacial Coating," Journal of the Electrochemical Society 169(4):040529, 9 pages (2022).
Ruhl, et al., "Impact of Solvent Treatment of the Superionic Argyrodite Li6PS5Cl on Solid-State Battery Performance," Advanced Energy & Sustainability Research 2(2):2000077, 10 pages (2021).
Sun, et al., "Insights on the Properties of the O-Doped Argyrodite Sulfide Solid Electrolytes (Li6PS5-xClOx,x=0-1)," ACS Applied Materials & Interfaces 13(46), pp. 54924-54935 (2021).
Tan, et al., "Elucidating Reversible Electrochemical Redox of Li6PS5Cl Solid Electrolyte," ACS Energy Letters 4(10), pp. 2418-2427 (2019).
Wang, et al., "Bidirectionally Compatible Buffering Layer Enables Highly Stable and Conductive Interface for 4.5 V Sulfide-Based All-Solid-State Lithium Batteries," Advanced Energy Materials 11(32):2100881, 9 pages (2021).
Warburton, et al., "Descriptor-Based Analysis of Atomic Layer Deposition Mechanisms on Spinel LiMn2O4 Lithium-Ion Battery Cathodes," Chemistry of Materials 32(5), pp. 1794-1806 (2020).
Yu, et al., "Facile Synthesis toward the Optimal Structure-Conductivity Characteristics of the Argyrodite Li6PS5Cl Solid-State Electrolyte," ACS Applied Materials & Interfaces 10(39), pp. 33296-33306 (2018).
Zhang, et al., "All-solid-state batteries with slurry coated LiNi0.8Co0.1Mn0.1O2 composite cathode and Li6PS5Cl electrolyte: Effect of binder content," Journal of Power Sources 391, pp. 73-79 (2018).
Zhang, et al., "Poly(ethylene oxide) reinforced Li6PS5Cl composite solid electrolyte for all-solid-state lithium battery: Enhanced electrochemical performance, mechanical property and interfacial stability," Journal of Power Sources 412, pp. 78-85 (2019).
Zhou, et al., "Innovative Approaches to Li-Argyrodite Solid Electrolytes for All-Solid-State Lithium Batteries," Accounts of Chemical Research 54(12), pp. 2717-2728 (2021).
Zhou, et al., "Observation of Interfacial Degradation of Li6PS5Cl against Lithium Metal and LiCoO2 via In Situ Electrochemical Raman Microscopy," Batteries & Supercaps 3(7), pp. 647-652 (2020).

* cited by examiner

MULTIFUNCTIONAL COATINGS FOR SOLID STATE ELECTROLYTE POWDERS

GOVERNMENT RIGHTS

This invention was made with government support under Contract No. DE-AC02-06CH11357 awarded by the United States Department of Energy to UChicago Argonne, LLC, operator of Argonne National Laboratory. The government has certain rights in the invention.

FIELD

The present technology is generally related to solid electrolytes, particularly argyrodite type solid electrolytes.

BACKGROUND

Solid-state batteries ("SSB") demonstrate exciting potential for improved safety as they replace the flammable liquid electrolyte in conventional Li- and Na-ion batteries with a non-flammable solid electrolyte. Currently rapid development of solid-state electrolytes ("SSE") has been driven by the successful exploration for materials that are superionic Li, Na, or Mg conductors at room temperature. One type of material under consideration for SSE is argyrodite materials. The term "argyrodite" refers to the category of materials having a similar structure to silver germanium sulfide mineral ($Ag_8GeS_6$) commonly referred to as argyrodite mineral. The general chemical formula for the class of argyrodite solid electrolytes can be written as M-P—S—X (where M=Li, Mg, Na, Ca, and X=halide such as F, Br, Cl, I). More specifically, the argyrodite materials may be superionic conductors taking the form of $Li_{7-x}BCh_{6-x}X_x$, where 0<x<1, B is phosphorous or arsenic, Ch is a chalcogen such as sulfur or selenium, and X is a halide (e.g., F, Cl, Br, or I). For example, lithium argyrodites with the composition of $Li_6PS_5Cl$ exhibited a high ionic conductivity of up to 1.5 $10^{-2}$ S/cm, which is several orders better than the best known LiPON material ionic conductivity (~$10^{-6}$ S/cm) at room temperature.

However, argyrodite-type materials are highly air sensitive, which creates manufacturing and ease-of-use issues. Therefore these materials are typically handled in a controlled environment, such as in a glove box inert environment. Glove-box handling can be cumbersome and create additional burdens to manufacturing. Furthermore, even when these materials are handled in a controlled environment, there is still a risk of air exposure during transfer. Air can react with the argyrodite-type material to cause surface degradation and poor electrochemical performance. An additional challenge is that interfacial contact between argyrodite and anodic or cathodic components promotes the degradation of argyrodite. This degradation greatly reduces the ionic conductivity of the argyrodite-type material. The resulting loss in ionic conductivity has been attributed to decomposition and interface reactions that form insulating side products.

There have been numerous attempts at addressing the high interfacial impedance generally in SSBs. In order to stabilize SSEs from the reactive electrodes, the majority of recent developments in SSBs have focused primarily on coating either anode or cathode materials, or on applying coatings to SSEs after they have already been processed into their final form factor. All of these approaches add significant cost and complexity. For example, post-manufacturing coating of brittle SSE membranes can be challenging.

Therefore, there remains a need for an argyrodite-type material that is functional as an SSE, forms stable interfaces with electrode materials, and can be handled in air while maintaining a higher ionic conductivity.

SUMMARY

In one aspect, a method includes providing within an atomic layer deposition (ALD) reactor a lithium argyrodite powder of formula $Li_{7-x}BCh_{6-x}X_x$, where 0<x<1, B is phosphorous or arsenic, Ch is sulfur or selenium, and X is F, Cl, Br, I, or a mixture of any two or more thereof. The method also includes depositing a first coating on the lithium argyrodite powder by an ALD process to form a coated lithium argyrodite powder. Depositing includes (A) introducing a first precursor gas into the ALD reactor to form first precursor complexes on surfaces of the lithium argyrodite powder; and (B) introducing a first co-reactant into the ALD reactor, the first co-reactant reactive with the first precursor complexes.

In some embodiments, the method further includes forming the coated lithium argyrodite powder into a pellet, membrane, or film. The pellet, membrane, or film may have an ionic conductivity of about 0.25 mS $cm^{-1}$ to about 25 mS $cm^{-1}$ and an electronic conductivity of about $10^{-12}$ S $cm^{-1}$ to $10^{-7}$ S $cm^{-1}$. The first precursor gas may include aluminum, zinc, magnesium, zirconium, titanium, yttrium, silicon, lithium, or niobium. The first co-reactant may be selected from oxygen, ozone, hydrogen peroxide, water, hydrogen sulfide, dimethyl sulfide, ammonia, hydrazine, dimethyl hydrazine, hydrogen fluoride, hydrogen fluoride pyridine, trimethyl phosphate, trimethyl phosphite, sulfur tetrafluoride, and sulfur hexafluoride.

Depositing the first coating may further include repeating step (A); and (C) introducing a second co-reactant into the ALD reactor, the second co-reactant reactive with the first precursor complex and different from the first co-reactant. The first co-reactant may be selected from oxygen, ozone, hydrogen peroxide and water, or a mixture of any two or more thereof. The second co-reactant may be selected from $H_2S$ and dimethyl sulfide. The first coating may include an oxysulfide. Depositing the first coating may further include repeating steps (A) and (B) a plurality of times interspersed with repeating steps (A) and (C) a plurality of times. A ratio of a number of steps (A) and (B) to a number of steps (A) and (C) may be varied over the deposition so that the first coating comprises a graded oxysulfide composition over the first coating's thickness. Depositing the first coating may include repeating steps (A) and (B) until a thickness of the coating is about 0.1 nm to about 15 nm.

The method may further include depositing a second coating on the first coating. The second coating may be different than the first coating and have a thickness of about 0.1 nm to about 15 nm. The lithium argyrodite powder may include lithium argyrodite particles having a diameter of about 25 nm to about 20 μm. Depositing the first coating may include, prior to step (A), depositing a seed coating comprising $Al_2O_3$ on the lithium argyrodite powder. The lithium argyrodite power may have the formula $Li_6PS_5X$.

In another aspect, a solid-state electrolyte (SSE) includes a lithium argyrodite of formula $Li_{7-x}BCh_{6-x}X_x$, where 0<x<1, B is phosphorous or arsenic, Ch is sulfur or selenium, and X is F, Cl, Br, I, or a mixture of any two or more thereof, the lithium argyrodite comprising particles, where X is F, Cl, Br, I, or a mixture of any two or more thereof, and a coating conformally disposed on outer surfaces of the particles. The coating may include an oxide, a sulfide, an oxysulfide, a nitride, a fluoride, a phosphate, or a mixture of two or more thereof.

In some embodiments, the particles may have a diameter of about 25 nm to about 20 μm. The coating may have a thickness of about 0.1 nm to about 15 nm. The SSE may have an ionic conductivity of about 0.25 mS $cm^{-1}$ to about 25 mS cm 1 and an electronic conductivity of about $10^{-12}$ S $cm^{-1}$ to $10^{-7}$ S $cm^{-1}$. The coating may include aluminum, zinc, magnesium, zirconium, titanium, yttrium, silicon, lithium, or niobium. The lithium argyrodite power may have the formula $Li_6PS_5X$.

In another aspect, a composite is disclosed. The composite includes particles of a lithium argyrodite of formula $Li_6PS_5X$, where X is F, Cl, Br, I, or a mixture of any two or more thereof. The composite also includes a coating conformally disposed on outer surfaces of the particles. The coating has a bandgap larger than a bandgap of the lithium argyrodite. A $\Delta E_{rxn}$ of the reaction between the coating and the lithium argyrodite and a $\Delta E_{rxn}$ of the reaction between the coating and lithium metal are each less than or equal to about −0.4 eV/atom. The composite has an ionic conductivity of about 0.25 mS $cm^{-1}$ to about 25 mS $cm^{-1}$.

This summary is illustrative only and is not intended to be in any way limiting. Other aspects, inventive features, and advantages of the devices or processes described herein will become apparent in the detailed description set forth herein, taken in conjunction with the accompanying figures, wherein like reference numerals refer to like elements.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several implementations in accordance with the disclosure and are, therefore, not to be considered limiting of its scope, the disclosure will be described with additional specificity and detail through use of the accompanying drawings.

Figure 1:
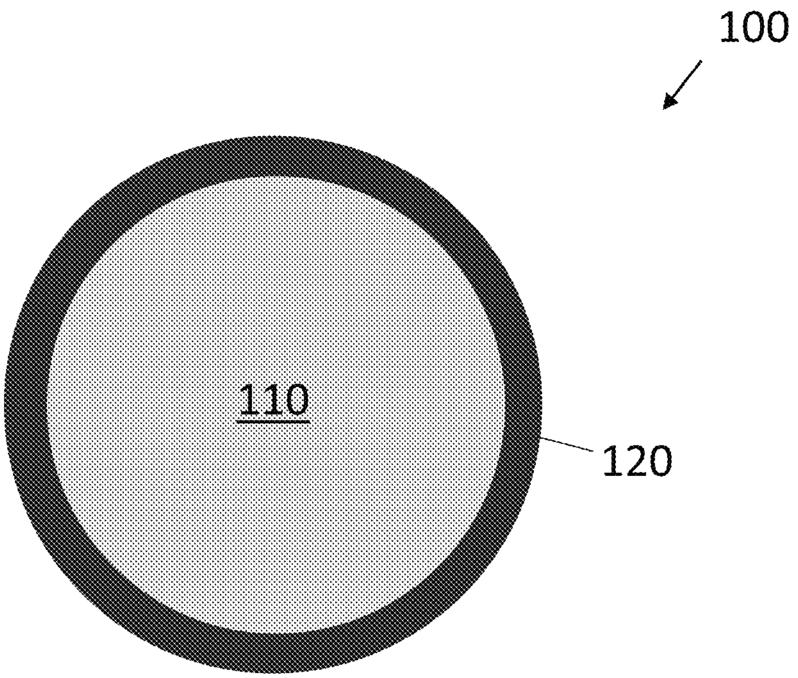
FIG. 1 is an illustration of an argyrodite particle coated with a sulfide-oxide gradient coating.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION

Various embodiments are described hereinafter. It should be noted that the specific embodiments are not intended as an exhaustive description or as a limitation to the broader aspects discussed herein. One aspect described in conjunction with a particular embodiment is not necessarily limited to that embodiment and can be practiced with any other embodiment(s).

As used herein, "about" will be understood by persons of ordinary skill in the art and will vary to some extent depending upon the context in which it is used. If there are uses of the term which are not clear to persons of ordinary skill in the art, given the context in which it is used, "about" will mean up to plus or minus 10% of the particular term.

The use of the terms "a" and "an" and "the" and similar referents in the context of describing the elements (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the embodiments and does not pose a limitation on the scope of the claims unless otherwise stated. No language in the specification should be construed as indicating any non-claimed element as essential.

Disclosed herein are methods of coating argyrodite powders, the resulting coated argyrodite powders, and SSEs and SSBs made with coated argyrodite powders. The coatings may be deposited on argyrodite powders via atomic layer deposition ("ALD") methods. The coatings may be deposited on the surfaces of free-flowing or unbound argyrodite powders. The argyrodite powders may be of the type (M-P—

S—X) (where M=Li, Mg, Na, and/or Ca; X=Cl, Br and/or I). The argyrodite powder may be a lithium argyrodite powder having the formula $Li_{7-x}BCh_{6-x}X_x$, where 0<x<1; B is phosphorous or arsenic; Ch is sulfur, selenium, or a mixture thereof; and X is F, Cl, Br, I, or a mixture of any two or more thereof. For example, the argyrodite material may have the formula $Li_6PS_5X$, where X is F, Cl, Br, I, or a mixture of any two or more thereof. For example, the lithium argyrodite may have the composition $Li_6PS_5Cl$. As further described below, the argyrodite materials can be selectively modified by adjusting ALD processing parameters, such as processing temperature, precursor nature and type, processing time, degree of precursor saturation, and number of ALD cycles.

The coating is deposited on the surfaces of the argyrodite powder. In some implementations, the coating conformally coats argyrodite particles in the argyrodite powder. The coating may fully or partially encapsulate argyrodite particles. The coating may not significantly degrade or react with argyrodite material. Instead, the coating may provide a degree of protection against surface degradation and poor electrochemical performance and cycling characteristics. For example, the coating may protect the argyrodite powder from degradation caused by reaction with moisture and/or air. In this way, the coated argyrodite powder is more moisture-tolerant than conventional argyrodite powders. Moisture-tolerance provides improved processability and handling outside of controlled environments.

The coating may also be chemically compatible with the SSB electrodes, to reduce or prevent degradation of an argyrodite SSE at the interfaces with the electrodes in an SSB. In this way, the coated argyrodite powder may more effectively maintain a higher ionic conductivity and a lower electronic conductivity. The lower impedance at the interface between the argyrodite SSE and the cathode may, among other things, improve rate capability. Furthermore, because of the stability of the coating on the argyrodite powder, the SSB may not need additional coatings on the electrodes to promote cycling stability. In some implementations, the coating promotes higher ionic conductivity and lower electronic conductivity of the resulting coated argyrodite SSE.

The argyrodite material upon which the coating is deposited may be in the form of a powder. FIG. 1 is an illustration of a cross-sectional view of a coated argyrodite particle 100. The coated argyrodite particle 100 includes an argyrodite particle 110 and the coating 120 disposed on the outer surfaces of the particle. The argyrodite powder may include particles having a diameter of about 25 nm to about 20 μm (e.g., about 50 nm to about 10 μm, about 100 nm to about 5 μm, about 100 nm to about 2 μm, or about 200 nm to about 1 μm). The coating may have a thickness of about 0.1 nm to about 30 nm (e.g., 0.1 nm to about 15 nm, 1 nm to 15 nm, 2 nm to 14 nm, or 5 nm to 10 nm).

In some implementations, the coated argyrodite particle 100 includes a seeding layer disposed between the argyrodite particle 110 and the coating 120. The seeding layer may promote adhesion of the coating 120 to the argyrodite particle surface. The seedling layer may also nucleate the ALD chemistry and growth of the coating 120 on the argyrodite particle surface. For example, the seeding layer may have a thickness of about 0.1 nm to about 15 nm (e.g., 0.1 nm to about 10 nm, 0.1 nm to about 5 nm, 0.1 nm to about 1 nm, or about 0.1 nm to about 0.5 nm). The seeding layer may be a metal oxide (e.g., aluminum oxide), a metal sulfide (e.g., aluminum sulfide), a metal nitride (e.g., aluminum nitride), or a metal fluoride (e.g., aluminum fluoride).

Figure 2:
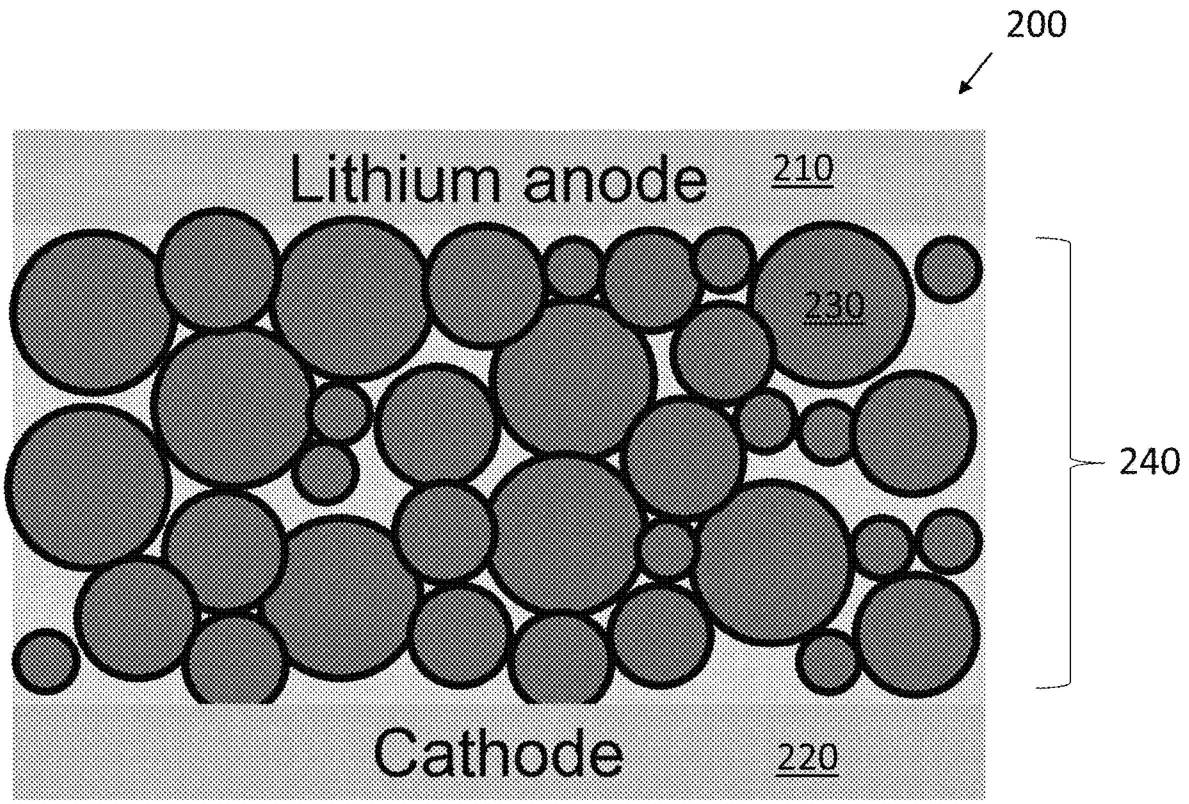
FIG. 2 is an illustration of a SSB with an SSE including coated argyrodite powders.

FIG. 2 is an illustration of a SSB 200 with an anode 210, a cathode 220, and an SSE 240. The SSE 240 includes coated argyrodite powders 230 (e.g., including the coated particle 100) formed into a monolithic material. After depositing the coating, the coated argyrodite powders 230 may be formed into monolithic SSE materials (e.g., pellets, membranes, or films) for use in SSBs. For example, the coated argyrodite powders may be cold pressed at a temperature of about 15° C. to about 30° C. (e.g., 25° C.) and a pressure of about 100 megapascals (MPa) to about 1500 MPa (e.g., 500 MPa to 1000 MPa, or 700 MPa) to form a pellet. For example, the coated argyrodite powders may be cast or spray-deposited as membranes or films (e.g., via solvent-based or dry processing methods). The cast or spray-deposition may be used, for example, in roll-to-roll processing for scalable manufacturing. The SSE 240 may include conductive additives and/or binders, as described in more detail below.

The cathode 220 may be a composite including one or more active materials. In some implementations, the cathode 220 includes an amount of the coated argyrodite powders 230. The coated argyrodite powders in the cathode 220 may have a different coating than the coated argyrodite powders in the SSE 240. The cathode 220 may also include conductive additives and/or binders, as described in more detail below. A mixture of cathode active materials and other components may be mixed in powdered form and then formed into a monolith. For example, the cathode materials may be pressed into a pellet to form the cathode 220. As another example, the cathode material may be cast or spray-deposited as membranes or films (e.g., via solvent-based or dry processing methods) to form the cathode 220.

Illustrative cathode active materials may include, but are not limited to, a spinel, a olivine, a carbon-coated olivine, $LiFePO_4$, $LiCoO_2$, $LiNiO_2$, $LiNi_{1-x}Co_yM^4{}_ZO_2$, $LiMn_{0.5}Ni_{0.5}O_2$, $LiMn_{1/3}CO_{1/3}Ni_{1/3}O_2$, $LiMn_2O_4$, $LiFeO_2$, $LiM^4{}_{0.5}Mn_{1.5}O_4$, $Li_{1+x''}Ni_\alpha Mn_\beta CO_\gamma M^5{}_\delta \cdot O_{2-z''}F_{z''}$, or $VO_2$. In the cathode active materials, $M^4$ is Al, Mg, Ti, B, Ga, Si, Mn, or Co; $M^5$ is Mg, Zn, Al, Ga, B, Zr, or Ti; A is Li, Ag, Cu, Na, Mn, Fe, Co, Ni, Cu, or Zn; 0≤x≤0.3; 0≤y≤0.5; 0≤z≤0.5; 0≤x"≤0.4; 0≤α≤1; 0≤β≤1; 0≤γ≤1; 0≤δ≤0.4; and 0≤z"≤0.4; with the proviso that at least one of α, β and γ is greater than 0. In some embodiments, the cathode includes $LiFePO_4$, $LiCoO_2$, $LiNiO_2$, $LiNi_{1-x}Co_yM^4{}_2O_2$, $LiMn_{0.5}Ni_{0.5}O_2$, $LiMn_{1/3}CO_{1/3}Ni_{1/3}O_2$, $LiMn_2O_4$, $LiCr_{0.5}Mn_{1.5}O_4$, $LiCrMnO_4$, $LiFe_{0.5}Mn_{1.5}O_4$, $LiCO_{0.5}Mn_{1.5}O_4$, $LiCoMnO_4$, $LiCoMnO_4$, $LiNi_{0.5}Mn_{1.5}O_4$, $LiNiPO_4$, $LiCoPO_4$, $LiMnPO_4$, $LiCoPO_4F$, $Li_2MnO_3$, $Li_5FeO_4$, and $Li_{x'}(Met)\ O_2$, wherein Met is a transition metal and 1<x'≤2. In some embodiments, Met is Ni, Co, Mn, or a mixture of any two or more thereof. In some embodiments, Met is a mixture of Ni, Co, and Mn. In some embodiments, the cathode active material may include $LiFePO_4$, $LiCoO_2$, $LiNiO_2$, $LiNi_{1-x}Co_yM^4{}_2O_2$, $LiMn_{0.5}Ni_{0.5}O_2$, $LiMn_{1/3}CO_{1/3}Ni_{1/3}O_2$, $LiMn_2O_4$, $LiCr_{0.5}Mn_{1.5}O_4$, $LiCrMnO_4$, $LiFe_{0.5}Mn_{1.5}O_4$, $LiCO_{0.5}Mn_{1.5}O_4$, $LiCoMnO_4$, $LiCoMnO_4$, $LiNi_{0.5}Mn_{1.5}O_4$, $LiNiPO_4$, $LiCoPO_4$, $LiMnPO_4$, $LiCoPO_4F$, $Li_2MnO_3$, $Li_5FeO_4$, or $Li_{x'}(Met)\ O_2$, where Met is a transition metal and 1<x'≤2.

The anode 210 may be a metal foil or composite. For example, the metal foil may be Li, Mg, Na, and/or Ca metal. In implementations where the anode 210 is a composite, the composite may include one or more anode active materials. In some implementations, the anode 210 includes an amount of the coated argyrodite powders 230. The coated argyrodite powders in the anode 210 may have a different coating than the coated argyrodite powders in the SSE 240. The anode 210 may also include conductive additives and/or binders, as described in more detail below. A mixture of anode active materials and other components may be mixed in powdered form and then formed into a monolith. For example, the anode materials may be pressed into a pellet to form the anode 210. As another example, the cathode material may be cast or spray-deposited as membranes or films (e.g., via solvent-based or dry processing methods) to form the anode 210.

Illustrative anode materials include metallic anode active materials such as lithium, sodium, or magnesium; sulfur materials; metal oxides such as $TiO_2$ or $Li_4Ti_5O_{12}$; or carbon materials including, but not limited to, synthetic graphite, natural graphite, amorphous carbon, hard carbon, soft carbon, mesocarbon microbeads (MCMB). In any of the above embodiments, the anode may include a graphite material, alloys, intermetallics, silicon, silicon oxides, $TiO_2$ and $Li_4Ti_5O_{12}$, and composites thereof. For example, the anode active material may include a metallic anode material intercalated within a host material, where the metallic anode material includes, but is not limited to, lithium, sodium, or magnesium, and the host material may be an active carbon material including, but not limited to, synthetic graphite, natural graphite, amorphous carbon, hard carbon, soft carbon, mesocarbon microbeads (MCMB). In other embodiments, the metallic anode material includes, but is not limited to, lithium, sodium, or magnesium, and metallic anode material is dispersed in a host material, which may be an alloy, intermetallic, silicon, silicon oxide, $TiO_2$, $Li_4Ti_5O_{12}$, or mixtures of any two or more thereof. In some embodiments, the anode active material is a lithiated carbon material such as lithiated graphite. Example anode materials for the lithium battery include, but are not limited to, Li metal, meso-carbon microbeads, natural graphite, synthetic graphite, soft carbon, hard carbon, and Si-based alloys.

The SSE 240, cathode 220, and/or anode 210 of the SSB 200 may also include one or more conductive additive. In some embodiments, the conductive additive may be a conductive carbon. Examples of conductive carbons include synthetic graphite, natural graphite, amorphous carbon, hard carbon, soft carbon, acetylene black, mesocarbon microbeads (MCMB), carbon black, Ketjen® black, mesoporous carbon, porous carbon matrix, carbon nanotube, carbon nanofiber, and/or graphene.

The SSB 200 may also include current collectors. Current collectors for the anode 210 and/or the cathode 220 may include those of copper, stainless steel, titanium, tantalum, platinum, gold, aluminum, nickel, cobalt nickel alloy, highly alloyed ferritic stainless steel containing molybdenum and chromium; or nickel-, chromium-, or molybdenum-containing alloys.

The SSE 240, cathode 220, and/or anode 210 of the SSB 200 may include one or more binder that holds the electrode active material and other materials in the electrode to the current collector. Illustrative binders include, but are not limited to, polyvinylidene difluoride (PVDF), polyvinyl alcohol (PVA), polyethylene, polystyrene, polyethylene oxide, polytetrafluoroethylene (Teflon), polyacrylonitrile, polyimide, styrene butadiene rubber (SBR), carboxy methyl cellulose (CMC), alginate, gelatin, a copolymer of any two or more such polymers, or a blend of any two or more such polymers.

The coating material may be selected by considering a number of factors. These factors may include the thermodynamics of chemical reactions between the coating material and the argyrodite material, the cathode material, and the anode material. The thermodynamics may indicate chemical compatibility of coating materials in SSBs. Another factor is the relative size of the bandgap of the coating material relative to the bandgap of the argyrodite material. A coating with a bandgap larger than the bandgap of the argyrodite material may favorably reduce electronic conductivity of the coated argyrodite. Another factor is the ionic conductivity of the coating, where higher ionic conductivities are favorable for not diminishing the ionic conductivity of the coated argyrodite.

Table 1 provides $\Delta E_{rxn}$ for the reaction between an argyrodite SSE and the selected metal oxides that may be the coating material. The $\Delta E_{rxn}$ values herein were calculated using a thermodynamic model based on density functional theory. The coating material's chemical compatibility with the argyrodite material may be suggested by a lower $\Delta E_{rxn}$ of the reaction between the coating material and the argyrodite material. The $\Delta E_{rxn}$ of the reaction between the coating and argyrodite material may be about −0.6 eV/atom or less, −0.5 eV/atom or less, −0.4 eV/atom or less, −0.3 eV/atom or less, −0.2 eV/atom or less, or −0.1 eV/atom or less. For example, the $\Delta E_{rxn}$ of the reaction between the coating material and $Li_6PS_5Cl$ may be −0.4 eV/atom or less. Results in Table 1 indicate that the lower $\Delta E_{rxn}$ values, in order from lower to higher, are $SiO_2$, $Al_2O_3$, $ZrO_2$, MgO, $TiO_2$, $Y_2O_3$, $Nb_2O_5$, MnO, and $Cr_2O_3$.

TABLE 1

$\Delta E_{rxn}$ for the reaction between $Li_6PS_5Cl$ and metal oxide coating materials

| Oxide | Reaction | Energy |
|---|---|---|
| $Ag_2O$ | $0.1111\ Li_6PS_5Cl + 0.8889\ Ag_2O \rightarrow 0.1111\ Li_3PO_4 + 0.4444\ Ag_2S + 0.1111\ LiCl + 0.1111\ Li_2SO_4 + 0.8889\ Ag$ | −0.549 |
| $Al_2O_3$ | $0.2\ Li_6PS_5Cl + 0.8\ Al_2O_3 \rightarrow 0.2\ Li_3PS_4 + 0.2\ LiCl + 0.1\ LiAlS_2 + 0.3\ LiAl_5O_8$ | −0.044 |
| BaO | $0.2\ Li_6PS_5Cl + 0.8\ BaO \rightarrow 0.1\ BaCl_2 + 0.3\ Li_2S + 0.7\ BaS + 0.2\ Li_3PO_4$ | −0.466 |
| CaO | $0.2\ Li_6PS_5Cl + 0.8\ CaO \rightarrow 0.2\ Li_2S + 0.2\ Li_3PO_4 + 0.8\ CaS + 0.2\ LiCl$ | −0.304 |
| CdO | $0.2\ Li_6PS_5Cl + 0.8\ CdO \rightarrow 0.2\ Li_2S + 0.2\ Li_3PO_4 + 0.8\ CdS + 0.2\ LiCl$ | −0.466 |
| CoO | $0.1818\ Li_6PS_5Cl + 0.8182\ CoO \rightarrow 0.1591\ Li_2S + 0.1818\ Li_3PO_4 + 0.09091\ Co_9S_8 + 0.1818\ LiCl + 0.02273\ Li_2SO_4$ | −0.438 |
| $Cr_2O_3$ | $0.4286\ Li_6PS_5Cl + 0.5714\ Cr_2O_3 \rightarrow 0.8571\ LiCrS_2 + 0.4286\ Li_3PO_4 + 0.1429\ Cr_2S_3 + 0.4286\ LiCl$ | −0.256 |
| $Cu_2O$ | $0.2\ Li_6PS_5Cl + 0.8\ Cu_2O \rightarrow 0.1333\ Li_3CuS_2 + 0.1833\ Cu_7S_4 + 0.2\ Li_3PO_4 + 0.2\ LiCl + 0.1833\ Cu$ | −0.384 |
| FeO | $0.2\ Li_6PS_5Cl + 0.8\ FeO \rightarrow 0.2\ Li_2S + 0.2\ Li_3PO_4 + 0.8\ FeS + 0.2\ LiCl$ | −0.374 |
| $Ga_2O_3$ | $0.4286\ Li_6PS_5Cl + 0.5714\ Ga_2O_3 \rightarrow 0.1429\ Ga_2S_3 + 0.4286\ Li_3PO_4 + 0.8571\ LiGaS_2 + 0.4286\ LiCl$ | −0.296 |

TABLE 1-continued $\Delta E_{rxn}$ for the reaction between $Li_6PS_5Cl$ and metal oxide coating materials

| Oxide | Reaction | Energy |
|---|---|---|
| $In_2O_3$ | 0.4286 $Li_6PS_5Cl$ + 0.5714 $In_2O_3$ → 0.4286 $Li_3PO_4$ + 0.8571 $LiInS_2$ + 0.4286 LiCl + 0.1429 $In_2S_3$ | −0.34 |
| $K_2O$ | 0.2 $Li_6PS_5Cl$ + 0.8 $K_2O$ → 0.4 $K_2S$ + 0.2 $Li_3PO_4$ + 0.6 KLiS + 0.2 KCl | −0.569 |
| $Li_2O$ | 0.2 $Li_6PS_5Cl$ + 0.8 $Li_2O$ → $Li_2S$ + 0.2 $Li_3O_4$ + 0.2 LiCl | −0.278 |
| MgO | 0.2 $Li_6PS_5Cl$ + 0.8 MgO → 0.2 $Li_3PO_4$ + 0.2 $Li_2S$ + 0.2 LiCl + 0.8 MgS | −0.125 |
| MnO | 0.2 $Li_6PS_5Cl$ + 0.8 MnO → 0.06667 $Li_6MnS_4$ + 0.7333 MnS + 0.2 $Li_3PO_4$ + 0.2 LiCl | −0.202 |
| $MoO_2$ | 0.3333 $Li_6PS_5Cl$ + 0.6667 $MoO_2$ → 0.3333 $Li_3PO_4$ + 0.6667 $MoS_2$ + 0.3333 $Li_2S$ + 0.3333 LiCl | −0.459 |
| $Na_2O$ | 0.2 $Li_6PS_5Cl$ + 0.8 $Na_2O$ → 0.6 NaLiS + 0.2 $Li_3PO_4$ + 0.2 NaCl + 0.4 $Na_2S$ | −0.462 |
| $Nb_2O_5$ | 0.5556 $Li_6PS_5Cl$ + 0.4444 $Nb_2O_5$ → 0.5614 $NbS_3$ + 0.5556 $Li_3PO_4$ + 0.04678 $Li_6(NbS_2)_7$ + 0.4386 $Li_2S$ + 0.5556 LiCl | −0.2 |
| NiO | 0.1818 $Li_6PS_5Cl$ + 0.8182 NiO → 0.1591 $Li_2S$ + 0.09091 $Ni_9S_8$ + 0.1818 $Li_3O_4$ + 0.1818 LiCl + 0.02273 $Li_2SO_4$ | −0.424 |
| PdO | 0.1111 $Li_6PS_5Cl$ + 0.8889 PdO → 0.04938 $Pd_{16}S_7$ + 0.09877 PdS + 0.1111 $Li_3PO_4$ + 0.1111 LiCl + 0.1111 $Li_2SO_4$ | −0.615 |
| $Rb_2O$ | 0.2 $Li_6PS_5Cl$ + 0.8 $Rb_2O$ → 0.2 $Li_3PO_4$ + 0.4 $Rb_2S$ + 0.6 RbLiS + 0.2 RbCl | −0.593 |
| $Sc_2O_3$ | 0.429 $Li_6PS_5Cl$ + 0.0.571 $Sc_2O_3$ → 0.036 $Li_3Sc_2(PO_4)_3$ + 1.071 $LiScS_2$ + 0.321 $Li_3PO_4$ + 0.429 LiCl | −0.132 |
| $SnO_2$ | 0.3333 $Li_6PS_5Cl$ + 0.6667 $SnO_2$ → 0.5 $SnS_2$ + 0.1667 $Li_4SnS_4$ + 0.3333 LiCl + 0.3333 $Li_3PO_4$ | −0.285 |
| SrO | 0.2 $Li_6PS_5Cl$ + 0.8 SrO → 0.8 SrS + 0.2 LiCl + 0.2 $Li_2S$ + 0.2 $Li_3PO_4$ | −0.39 |
| $TiO_2$ | 0.3333 $Li_6PS_5Cl$ + 0.6667 $TiO_2$ → 0.1111 $Li_4TiS_4$ + 0.2222 $Li(TiS_2)_2$ + 0.1111 $TiS_3$ + 0.3333 LiCl + 0.3333 $Li_3PO_4$ | −0.126 |
| $V_2O_5$ | 0.4146 $Li_6PS_5Cl$ + 0.5854 $V_2O_5$ → 0.9756 $VS_2$ + 0.1951 $Li_3VO_4$ + 0.122 $Li_2SO_4$ + 0.4146 LiCl + 0.4146 $Li_3PO_4$ | −0.401 |
| $Y_2O_3$ | 0.4286 $Li_6PS_5Cl$ + 0.5714 $Y_2O_3$ → 1.071 $LiYS_2$ + 0.07143 $YPO_4$ + 0.3571 $Li_3PO_4$ + 0.4286 LiCl | −0.176 |
| ZnO | 0.2 $Li_6PS_5Cl$ + 0.8 ZnO → 0.2 $Li_2S$ + 0.2 $Li_3PO_4$ + 0.8 ZnS + 0.2 LiCl | −0.372 |
| $ZrO_2$ | 0.3333 $Li_6PS_5Cl$ + 0.6667 $ZrO_2$ → 0.3333 $Li_2S$ + 0.6667 $ZrS_2$ + 0.3333 $Li_3PO_4$ + 0.3333 LiCl | −0.097 |
| $SiO_2$ | No reaction | 0 |

Table 2 is a data visualization of $\Delta E_{rxn}$ for the reaction between lithium metal and the selected metal oxides that may be the coating material. The coating material's chemical compatibility with the anode material (e.g., lithium metal) may be suggested by a lower $\Delta E_{rxn}$ of the reaction between the coating material and the anode material. The $\Delta E_{rxn}$ of the coating reacting with the anode material may be about −1 eV/atom or less, −0.9 eV/atom or less, −0.8 eV/atom or less, −0.7 eV/atom or less, −0.6 eV/atom or less, −0.5 eV/atom or less, −0.4 eV/atom or less, −0.3 eV/atom or less, −0.2 eV/atom or less, or −0.1 eV/atom or less. For example, the $\Delta E_{rxn}$ of the coating material reacting with Li metal may be −0.6 eV/atom or less. Results in Table 2 indicate that the lower $\Delta E_{rxn}$ values, in order from lower to higher, are $Y_2O_3$, CaO, $Li_2O$, SrO, $Sc_2O_3$, MgO, BaO, $ZrO_2$, and $Al_2O_3$.

TABLE 2

$\Delta E_{rxn}$ for the reaction between lithium and metal oxide coating materials

| Oxide | Reaction | Energy |
|---|---|---|
| $Ag_2O$ | 0.6667 Li + 0.3333 $Ag_2O$ → 0.3333 $Li_2O$ + 0.6667 Ag | −1.043 |
| $Al_2O_3$ | 0.6667 Li + 0.3333 $Al_2O_3$ → 0.1667 LiAl + 0.5 $LiAlO_2$ | −0.22 |
| BaO | 0.6667 Li + 0.3333 BaO → 0.3333 $Li_2O$ + 0.3333 Ba | −0.134 |
| CdO | 0.6667 Li + 0.3333 CdO → 0.3333 $Li_2O$ + 0.3333 Cd | −0.864 |
| CoO | 0.6667 Li + 0.3333 CoO → 0.3333 $Li_2O$ + 0.3333 Co | −0.904 |
| $Cr_2O_3$ | 0.8571 Li + 0.1429 $Cr_2O_3$ → 0.4286 $Li_2O$ + 0.2857 Cr | −0.611 |
| $Cu_2O$ | 0.6667 Li + 0.3333 $Cu_2O$ → 0.3333 $Li_2O$ + 0.6667 Cu | −0.85 |
| FeO | 0.6667 Li + 0.3333 FeO → 0.3333 $Li_2O$ + 0.3333 Fe | −0.805 |
| $Ga_2O_3$ | 0.8679 Li + 0.1321 $Ga_2O_3$ → 0.03774 $Li_2Ga_7$ + 0.3962 $Li_2O$ | −0.665 |
| $In_2O_3$ | 0.8571 Li + 0.1429 $In_2O_3$ → 0.4286 $Li_2O$ + 0.2857 In | −0.779 |
| $K_2O$ | 0.6667 Li + 0.3333 $K_2O$ → 0.6667 K + 0.3333 $Li_2O$ | −0.488 |
| MgO | 0.75 Li + 0.25 MgO → 0.25 $Li_2O$ + 0.25 LiMg | −0.04 |
| MnO | 0.6667 Li + 0.3333 MnO → 0.3333 $Li_2O$ + 0.3333 Mn | −0.557 |
| $MoO_2$ | 0.8 Li + 0.2 $MoO_2$ → 0.4 $Li_2O$ + 0.2 Mo | −0.901 |
| $Na_2O$ | 0.6667 Li + 0.3333 $Na_2O$ → 0.6667 Na + 0.3333 $Li_2O$ | −0.374 |
| $Nb_2O_5$ | 0.8 Li + 0.2 $Nb_2O_5$ → 0.4 $LiNbO_2$ + 0.2 $Li_2O$ | −0.585 |
| NiO | 0.6667 Li + 0.3333 NiO → 0.3333 $Li_2O$ + 0.3333 Ni | −0.937 |
| PdO | 0.6818 Li + 0.3182 PdO → 0.04545 $LiPd_7$ + 0.3182 $Li_2O$ | −1.162 |
| $Rb_2O$ | 0.6667 Li + 0.3333 $Rb_2O$ → 0.6667 Rb + 0.3333 $Li_2O$ | −0.557 |
| $Sc_2O_3$ | 0.6 Li + 0.4 $Sc_2O_3$ → 0.6 $LiScO_2$ + 0.2 Sc | −0.034 |
| $SiO_2$ | 0.6667 Li + 0.3333 $SiO_2$ → 0.1667 $Li_4SiO_4$ + 0.1667 Si | −0.447 |
| $SnO_2$ | 0.8 Li + 0.2 $SnO_2$ → 0.4 $Li_2O$ + 0.2 Sn | −0.864 |
| SrO | 0.6667 Li + 0.3333 SrO → 0.3333 $Li_2O$ + 0.3333 Sr | −0.008 |
| $TiO_2$ | 0.6316 Li + 0.3684 $TiO_2$ → 0.1053 $Ti_2O$ + 0.1579 $Li_4TiO_4$ | −0.357 |

TABLE 2-continued

| $\Delta E_{rxn}$ for the reaction between lithium and metal oxide coating materials | | |
|---|---|---|
| Oxide | Reaction | Energy |
| $V_2O_5$ | $0.8\ Li + 0.2\ V_2O_5 \rightarrow 0.4\ LiVO_2 + 0.2\ Li_2O$ | −0.919 |
| ZnO | $0.7\ Li + 0.3\ ZnO \rightarrow 0.1\ LiZn_3 + 0.3\ Li_2O$ | −0.653 |
| $ZrO_2$ | $0.6122\ Li + 0.3878\ ZrO_2 \rightarrow 0.06122\ Zr_3O + 0.102\ Li_6Zr_2O_7$ | −0.185 |
| $Li_2O$ | $0.5\ Li + 0.5\ Li_2O \rightarrow 0.5\ Li + 0.5\ Li_2O$ | 0 |
| CaO | $0.5\ Li + 0.5\ CaO \rightarrow 0.5\ Li + 0.5\ CaO$ | 0 |
| $Y_2O_3$ | $0.5\ Li + 0.5\ Y_2O_3 \rightarrow 0.5\ Li + 0.5\ Y_2O_3$ | 0 |

Table 3 is a data visualization of the bandgap of selected binary metal oxides that may be the coating material. The bandgaps were calculated using electronic structure calculations based on density functional theory. A coating material with a larger bandgap than the argyrodite material may reduce electronic conductivity of the coated argyrodite. For example, the argyrodite material may be $Li_6PS_5Cl$ with a bandgap of 2.14 eV and the coating material may have a bandgap larger than 2.14 eV. Results in Table 3 indicate that, among others, SrO, $Sc_2O_3$, MgO, $ZrO_2$, $Al_2O_3$, $TiO_2$, $Y_2O_3$, and $Nb_2O_5$ have bandgaps larger than 2.14 eV.

TABLE 3

| Bandgaps of Metal Oxid Coating Materials | |
|---|---|
| Metal Oxide | Bandgap (eV) |
| $Al_2O_3$ | 8.8 |
| $SiO_2$ | 8.1 |
| MgO | 7.2 |
| $Y_2O_3$ | 6.2 |
| $Sc_2O_3$ | 6.3 |
| $ZrO_2$ | 5.9 |
| $TiO_2$ | 4.3 |
| CaO | 5.8 |
| SrO | 5.2 |
| BaO | 3.7 |
| $Li_2O$ | 7.2 |
| $K_2O$ | 3.5 |
| $Rb_2O$ | 3.0 |
| ZnO | 3.0 |
| $Ga_2O_3$ | 4.7 |
| $Ag_2O$ | 1.5 |
| CdO | 1.3 |
| $Cr_2O_3$ | 4.9 |
| $Cu_2O$ | 2.5 |
| MnO | 1.8 |
| NiO | 4.0 |
| PdO | 2.1 |
| CoO | 2.4 |
| $SnO_2$ | 3.6 |
| $Na_2O$ | 6.2 |
| $Fe_2O_3$ | 3.2 |
| $In_2O_3$ | 3.2 |
| $MoO_3$ | 4.1 |
| $V_2O_5$ | 4.1 |
| $Nb_2O_5$ | 3.7 |

The coating material may be selected so that the monolithic argyrodite (e.g., in the form of a pellet, membrane, or film) formed from the coated argyrodite may have an ionic conductivity of about 0.25 mS $cm^{-1}$ to about 25 mS $cm^{-1}$ (e.g., 0.5 mS $cm^{-1}$ to 20 mS $cm^{-1}$, 1 mS $cm^{-1}$ to 10 mS $cm^{-1}$, 0.5 mS $cm^{-1}$ to 2 mS $cm^{-1}$, 1 mS $cm^{-1}$ to 5 mS $cm^{-1}$, about 0.5 mS $cm^{-1}$, 1 mS $cm^{-1}$, 1.5 mS $cm^{-1}$, 2 mS $cm^{-1}$, 5 mS $cm^{-1}$, 10 mS $cm^{-1}$, 20 mS $cm^{-1}$, or 25 mS $cm^{-1}$). The coating material may be selected so that the monolithic argyrodite (e.g., in the form of a pellet, membrane, or film) formed from the coated argyrodite may have an electronic conductivity of about $10^{-12}$ S $cm^{-1}$ to $10^{-7}$ S $cm^{-1}$ (e.g., $10^{-11}$ S $cm^{-1}$ to $10^{-7}$ S $cm^{-1}$, $10^{-10}$ S $cm^{-1}$ to $10^{-8}$ S $cm^{-1}$, $10^{-9}$ S $cm^{-1}$ to $10^{-8}$ S $cm^{-1}$, about $10^{-10}$ S $cm^{-1}$, $10^{-9}$ S $cm^{-1}$ or lower, or $10^{-8}$ S $cm^{-1}$ or lower).

The coating material may include an aluminum-based material, a zinc-based material, a magnesium-based material, a zirconium-based material, a titanium-based material, an yttrium-based material, a silicon-based material, a lithium-based material, a niobium-based material, or a combination of two or more thereof. Any of these materials may be oxides, sulfides, nitrides, fluorides, phosphates, oxysulfides, oxynitrides, oxyfluorides, fluorinated nitrides, or combinations of two or more thereof. The coating material may include multiple layers of different materials (e.g., as a nanolaminate or multilayer film), graded compositions of varying concentrations, and/or materials doped with aluminum, zinc, magnesium, zirconium, titanium, yttrium, silicon, lithium, niobium, oxygen, sulfur, nitrogen, fluorine, or a combination of two or more thereof.

For example, the coating material may include an aluminum-based material. For example, the coating may include aluminum oxide, aluminum sulfide, aluminum nitride, aluminum fluoride, aluminum phosphate, aluminum oxysulfide, aluminum oxynitride, aluminum oxyfluoride, fluorinated aluminum nitride, or a mixture of two or more thereof.

For example, the coating material may include a zinc-based material. For example, the coating may include zinc oxide, zinc sulfide, zinc nitride, zinc fluoride, zinc phosphate, zinc oxysulfide, zinc oxynitride, zinc oxyfluoride, or a mixture of two or more thereof.

For example, the coating material may include a magnesium-based material. For example, the coating may include magnesium oxide, magnesium sulfide, magnesium nitride, magnesium fluoride, magnesium phosphate, magnesium oxysulfide, magnesium oxynitride, magnesium oxyfluoride, or a mixture of two or more thereof.

For example, the coating material may include a zirconium-based material. For example, the coating may include zirconium oxide, zirconium sulfide, zirconium nitride, zirconium fluoride, zirconium phosphate, zirconium oxysulfide, zirconium oxynitride, zirconium oxyfluoride, or a mixture of two or more thereof.

For example, the coating material may include a titanium-based material. For example, the coating may include titanium oxide, titanium sulfide, titanium nitride, titanium fluoride, titanium phosphate, titanium oxysulfide, titanium oxynitride, titanium oxyfluoride, or a mixture of two or more thereof.

For example, the coating material may include an yttrium-based material. For example, the coating may include yttrium oxide, yttrium sulfide, yttrium nitride, yttrium fluoride, yttrium phosphate, yttrium oxysulfide, yttrium oxynitride, yttrium oxyfluoride, or a mixture of two or more thereof.

For example, the coating material may include a niobium-based material. For example, the coating may include niobium oxide, niobium sulfide, niobium nitride, niobium fluoride, niobium phosphate, niobium oxysulfide, niobium oxynitride, niobium oxyfluoride, or a mixture of two or more thereof.

For example, the coating material may include a silicon-based material. For example, the coating may include silicon dioxide, silicon disulfide, silicon nitride, oxidized silicon sulfide, silicon oxynitride, or a mixture of two or more thereof.

For example, the coating material may include a lithium-based material. For example, the coating may include lithium oxide, lithium sulfide, lithium nitride, lithium fluoride, lithium phosphate, lithium oxysulfide, lithium oxynitride, or a mixture of two or more thereof.

In some implementations, the coating has a material gradient across its thickness. The material gradient may include two different coating materials, as described above, with changing concentrations across the thickness of the coating. For example, the material gradient may include two coating materials "A" and "B" that vary from 100% component A on one side of the coating to 100% component B on the other side of the coating. The material gradient may be, for example, 100% A and 0% B to 0% A and 100% B; 80% A and 20% B to 20% A and 80% B; 70% A and 30% B to 30% A and 70% B. In some implementations, the two coating materials include the same metal but different anions (e.g., component A is $ZrO_2$, and component B is $ZrS_2$).

In some implementations, the coating is a layered film. The layered film may include 2 to 10 layers (e.g., 2, 3, 4, 5, 6, 7, 8, 9, or 10 layers), with each layer having a thickness of about 0.1 nm to about 15 nm (e.g., 1 nm to 15 nm, 2 nm to 14 nm, or 5 nm to 10 nm). The layers may include any of the coating materials described above.

In another aspect, a method of depositing the coating on argyrodite powders is disclosed. The coating is deposited via thin film processing. The thin film processing may include atomic layer deposition (ALD) and/or chemical vapor deposition (CVD). The surface of the argyrodite particles in the argyrodite powder act as the substrates upon which the coating is deposited.

The ALD process may include a first precursor. The first precursor may be, for example, a material reactive or absorbable on the substrate to form a first ALD intermediate. The ALD process may include a first co-reactant. The first co-reactant is reactive with the ALD first intermediate.

Each ALD process may include a cycle or multiple repeated cycles, where cycles may be repeated to form a desired film thickness. A cycle includes introducing a precursor into a reactor via a precursor vapor pulse for an exposure time, followed by a purge, such as where the reactor is pumped to a vacuum to remove excess precursor, followed by a co-reactant pulse with a co-reactant exposure time followed by a co-reactant purge. It should be appreciated that the dose and purge time may be based on the self-limiting behavior of the precursors/co-reactants and the desired precursor utilization efficiency. The exposure time can be varied in a wide range from a few milliseconds to tens of seconds. Further if a longer dose than purge time is utilized, the times may need to increase to avoid a CVD-type reaction, which can result in non-uniformity and particle formation. The ALD process may be a spatial ALD process in which the argyrodite powder moves between spatially separated domains of precursor and co-reactant separated by domains of inert gas purge.

Typically, the ALD process takes place in a uniform temperature-controlled reactor. In some embodiments, the substrate can be heated to a predetermined temperature during the ALD process. For example, the first predetermined temperature can be in the range of 50° C.-350° C. (e.g., 50, 60, 70, 80, 90, 100, 110, 120, 130, 140, 150, 160, 170, 180, 190, . . . 350° C., inclusive of all ranges and values therebetween). In some embodiments, the predetermined temperature is in the range of 100-350° C. (e.g., 225° C.). Temperature also impacts the overall energy in the system and the performance for diffusion and/or reaction. In a given ALD process, the deposition temperature range may be the temperature range in which ALD deposition occurs at an approximately static growth rate as function of temperature, which is referred to as the "ALD window." The ALD reaction may occur at a temperature of the precursor sufficient to provide an approximately constant precursor evaporation rate (i.e., vapor pressure). If the precursor vapor pressure is insufficient to react with the reactive surface sites, there may still be layer growth, but the surface coverage may be less complete due to incomplete precursor saturation. If the vapor pressure is too high, precursor may be wasted, and CVD growth may occur if there is not sufficient purge time to remove the excess precursor. The temperature of the layer growth can be as low as the subliming or evaporation temperature of the ALD precursors. For example, if a precursor sublimes at 150° C., films may be grown around that temperature or a temperature higher than the sublimation temperature. Generally, layer growth temperature may be at least 10-50° C. higher than the precursor sublimation temperature. Further, a plasma may be used as the co-reactant or to enhance the growth rate or tailor the composition of the deposited layer or make the deposited material crystalline. To deposit ALD coatings on solid electrolytes, the coating can be deposited on solid electrolyte powders, solid electrolyte pellets, or monolithic laminates.

The first precursor may be a vapor and the first precursor pulse may introduce the first precursor vapor into the reactor for a first precursor pulse time of a few milliseconds to tens of seconds (e.g., 0.005, 0.01, 0.05, 0.1, 0.5, 1, 5, 10, 20, or 30 seconds, inclusive of all ranges and values therebetween). The first partial pressure of the first precursor pulse can be in the range of 0.01-1000 Torr (e.g., 10, 25, 50, 75, 100, 500, or 1000 Torr, inclusive of all ranges and values therebetween), such as, for example, at least 0.5-100 Torr. One of skill in the art will appreciate that the time length, pressure, and amount of precursor for the pulse are all factors in determining the overall amount for each of those operation parameters. For example, the pressure and amount may follow from the duration of the pulse but depend on the size of the chamber and the type of valve as would be understood from general knowledge regarding ALD. Note, for ease of reference herein, the process is described with regard to the pulse duration, but it should be understood that the precursor partial pressure is another means to control the precursor dose. For spatial ALD, the precursor exposure is controlled by the amount of time the substrate (e.g., powder) spends in the precursor spatial domain and the precursor partial pressure in the precursor spatial domain. A carrier gas, such as argon or other non-reactive (with the substrate or the precursors) gas, may be used.

The first precursor exposure may include exposing the substrate (i.e., the argyrodite powder) the to the first precursor for a first exposure time and a first partial pressure of the first precursor so that the first precursor binds with the substrate or a coating from prior ALD cycles on the substrate. In some embodiments, given the brief time for the pulse/exposure for the ALD process the pulse lasts the entire exposure until the purge starts with the pulse time and exposure time being the same. The first precursor pulse time may be less than the first exposure time, or they may be equal such that the exposure is the same as the pulse. The first exposure time can be in the range of 0.5-500 seconds (e.g., 0.5, 1, 5, 10, 20, 30, 40, 50, 60, 70, 80, 90, 100, 120, 140, 160, 180, 200, 220, 240, 260, 280, 300, 350, 400, 450 or 500 seconds or several minutes, inclusive of all ranges and values therebetween). In some embodiments, the first predetermined time is in the range of 1-10 seconds. The first partial pressure of the first precursor can be in the range of 0.01-10 Torr (e.g., 0.01, 0.05, 0.1, 0.5, 1.0, 5.0, or 10 Torr, inclusive of all ranges and values therebetween). The first partial pressure of the first precursor may be in the range of 0.1-1 Torr. ALD growth can also be performed at various reactor pressures (e.g., $10^{-4}$ Torr to 1000 Torr).

The first precursor purge evacuates unreacted precursor from the reactor. The first precursor purge may be for a first precursor purge time of 0.5-30 seconds (e.g., 0.5, 1, 5, 10, 20, or 30 seconds, inclusive of all ranges and values therebetween), such as 15 seconds. The first precursor purge may evacuate the reactor such that the total pressure in the reactor is reduced substantially to vacuum. Alternatively, the first precursor purge may consist of a constant flow of high purity carrier gas at a constant pressure that sweeps the unreacted precursor from the reactor. In either case, the first precursor purge reduces the partial pressure of the precursor in the reactor by a factor of $10^2$ to $>10^9$ (e.g., from an initial value of 1 Torr immediately following the first precursor exposure to a final value after the first precursor purge of $10^{-2}$ to $<10^{-9}$ Torr).

The substrate may be exposed to a first co-reactant. The first co-reactant is reactive with the first precursor adsorbed on the substrate or reactive species resulting from the first precursor's reaction with the substrate. The first co-reactant is introduced into the reactor for a first co-reactant exposure time and at a partial pressure of the first co-reactant so that first co-reactant reacts with the surface sites formed by the first precursor reacting with the substrate (or previous ALD deposited coatings). The first co-reactant exposure time can be in the range of 0.5-500 seconds (e.g., 0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween), such as about 1 second. The second partial pressure of the first co-reactant can be in the range of 0.01-10 Torr (e.g., 0.01, 0.05, 0.1, 0.5, 1.0, 5.0, or 10 Torr, inclusive of all ranges and values therebetween). In some embodiments, the second partial pressure of the first co-reactant is in the range of 0.1-1 Torr (e.g., about 0.5 Torr or 0.88 Torr). ALD growth can also be performed in various reactor pressures ($10^{-4}$ Torr to 1000 Torr).

The first co-reactant purge evacuates unreacted precursor from the reactor. The first co-reactant purge may be for a first co-reactant purge time of 0.5-500 seconds (0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween), such as 10 seconds. The first co-reactant purge may evacuate the reactor such that the total pressure is reduced substantially to vacuum. Alternatively, the first co-reactant purge may consist of a constant flow of high purity carrier gas at a constant pressure that sweeps the unreacted co-reactant from the reactor. In either case, the first co-reactant purge reduces the partial pressure of the co-reactant in the reactor by a factor of $10^2$ to $>10^9$ (e.g., from an initial value of 1 Torr immediately following the first co-reactant exposure to a final value after the first co-reactant purge of $10^{-2}$ to $<10^{-9}$ Torr).

The steps of introducing the first precursor and then the first co-reactant into the reactor as described above, which is 1 ALD cycle, may be repeated to deposit a uniform two-component coating on the substrate (e.g., only $Al_2O_3$, ZnO, ZnS, or $TiO_2$). In some implementations, additional precursors and/or co-reactants may be sequentially introduced into the reactor as part of a supercycle. The ALD process may include a supercycle or multiple repeated supercycles. A supercycle combines ALD cycles for two or more ALD processes. For instance, a supercycle combining two ALD processes includes performing one or more ALD cycles for a first ALD process followed by one or more ALD cycles for a second ALD process. Supercycles may be used to form layered films, doped films, and/or gradient coating, as described above. Gradient coatings may be formed by varying the number of ALD cycles of each ALD process included in the supercycle as the coating is deposited.

It should be appreciated that more complicated ALD schemes can be constructed as super-cycles. Super-cycles may include various sub-cycles for depositing a material, for depositing multiple different materials, for multiple doped coatings, or for depositing bi-(tri-, etc.) metallic materials. The material deposited may vary based on the deposition parameters for any of the individual steps within a super-cycle. For example, the deposition may be a doped layer, a multi-layer, an alloy, a nanocomposite, or a mixed metal composite. The respective pulse and purge times may be the same time or may be different for the different metal precursors and co-reactants.

The precursor for depositing coatings including aluminum constituents may include, for example, trimethyl aluminum (TMA), triethyl aluminum, aluminum chloride, dimethyl aluminum isopropoxide, aluminum bromide, aluminum t-butoxide, tris(dimethylamido)aluminum (III), or aluminumacetylacetonate, or aluminum isopropoxide.

The precursor for depositing coatings including zinc constituents may include, for example, diethyl zinc, dimethyl zinc, zinc acetylacetonate hydrate, or bis(2,2,6,6-tetramethyl-3,5-heptanedionato) zinc.

The precursor for depositing coatings including magnesium constituents may include, for example, bis(cyclopentadienyl)magnesium, bis(ethylcyclopentadienyl)magnesium, bis(N,N'-di-sec-butylacetamidinato)magnesium, bis (pentamethylcyclopentadienyl)magnesium, or bis(2,2,6,6-tetramethyl-3,5-heptanedionato) magnesium.

The precursor for depositing coatings including zirconium constituents may include, for example, tetrakis(dimethylamino) zirconium (IV), tetrakis(diethylamino) zirconium (IV), tetrakis(ethylmethylamino) zirconium (IV), bis (cyclopentadienyl)dimethylzirconium, zirconium (IV) n-butoxide, zirconium (IV) t-butoxide, zirconium chloride, or zirconium (IV) i-propoxide.

The precursor for depositing coatings including titanium constituents may include, for example, titanium tetrachloride, tetrakis(diethylamino) titanium (IV), tetrakis(dimethylamino) titanium (IV), pentamethylcyclopentadienyltitanium trimethoxide, titanium t-butoxide, or titanium (IV) i-propoxide.

The precursor for depositing coatings including yttrium constituents may include, for example, tris(butylcyclopentadienyl) yttrium, tris(ethylcyclopentadienyl) yttrium, tris (cyclopentadienyl) yttrium, tris [N,N-bis(trimethylsilyl) amide] yttrium (III), or yttrium (III) tris(2,2,6,6-tetramethyl-3,5-heptanedionate).

The precursor for depositing coatings including silicon constituents may include, for example, silicon tetrachloride, tri-t-butoxysilanol, bis(dimethylamino)dimethylsilane, 3-aminopropyltriethoxysilane, or tris(dimethylamino) silane.

The precursor for depositing coatings including niobium constituents may include, for example, trihydridobis(pentamethylcyclopentadienyl) niobium (V), niobium (V) ethoxide, niobium pentachloride, niobium pentafluoride, or (t-tutylimido)tris(diethylamino) niobium (V).

The precursor for depositing coatings including lithium constituents may include, for example, lithium t-butoxide, lithium bis(trimethylsilyl)amide, or 2,2,6,6-tetramethyl-3,5-heptanedionato lithium.

The co-reactant for depositing coatings including oxygen constituents may include, for example, water ($H_2O$), oxygen (O), ozone ($O_3$), hydrogen peroxide ($H_2O_2$), nitrous oxide ($N_2O$), or formaldehyde ($CH_2O$). The co-reactant for depositing coatings including sulfur constituents may include, for example, hydrogen sulfide ($H_2S$) or dimethyl sulfide $(CH_3)_2$ S. The co-reactant for depositing coatings including nitrogen constituents may include, for example, ammonia, hydrazine, dimethyl hydrazine, or nitrogen ($N_2$). The co-reactant for depositing coatings including fluorine constituents may include, for example, hydrogen fluoride or hydrogen fluoride pyridine. The co-reactant for depositing coatings including phosphorus constituents may include, for example, trimethyl phosphate and trimethyl phosphite. The co-reactant for depositing coatings including sulfur constituents may include, for example, sulfur tetrafluoride, or sulfur hexafluoride.

The present invention, thus generally described, will be understood more readily by reference to the following examples, which are provided by way of illustration and are not intended to be limiting of the present invention.

EXAMPLES

Example 1

The synthesis of ultrathin films of ALD alumina on $Li_6PS_5Cl$ (LPSCl) particles and the impact of these coatings on the bulk electrochemical properties of pellets pressed from coated powders are disclosed. The ALD coatings conformally coated the LPSCl particles with little chemical and structural change to the underlying material. Surprisingly, these materials exhibited little to no reactivity during the ALD process, despite exposure to pure water vapor at 150° C. These coatings provided tolerance of exposure of coated powders to pure and $H_2O$-saturated oxygen environments for ≥4 h with little to no reactivity, making coated powders amenable to processing in dry room environments. Furthermore, pellets pressed from coated powders unexpectedly exhibited bulk ionic conductivities up to 2× higher than those made from uncoated material, with a simultaneous decrease in electronic conductivity and significant suppression of reactivity at the Li-SSE interface. These benefits resulted in significantly improved room temperature cycle life at high capacity and current density (≥150 cycles at 1 mAh cm$^{-2}$ per cycle and 0.5 mA cm$^{-2}$). Without being bound by any theory, the enhanced properties may derive from improved electronic and chemical properties at intergranular boundaries, as well as improved Li metal wetting at the interface.

Materials Synthesis. Argyrodite SSEs ($Li_6PS_5Cl$) powders were purchased from commercial suppliers. In the ALD process to coat argyrodite $Li_6PS_5Cl$ powder with alumina, trimethyl aluminum (TMA) and deionized $H_2O$ were sequentially pulsed 1 to 100 times in order to grow films with thicknesses that span several orders of magnitude. The ALD process utilized a tubular viscous flow, hot-walled ALD reactor interfaced to an argon-filled glovebox. The $Al_2O_3$ ALD was performed at 150° C. using 500 sccm of ultrahigh purity Ar at a pressure of 0.8 Torr and the precursors were held in reservoirs maintained at room temperature. The argyrodite powder (1-10 g) was uniformly spread onto a shallow stainless-steel tray and covered by a fine steel mesh to contain the powder before loading into the ALD reactor and evacuating. After waiting 10 min for temperature equilibration under the ALD conditions, alternating exposures of TMA and $H_2O$ of 1 second(s) duration were performed, each precursor pulse separated by 10 s purge times.

Characterization. X-ray powder diffraction was carried out with Cu-Kα radiation (λ=1.5418 Å) for phase identification of the produced samples. The morphology was observed using field-emission scanning electron microscopy (FE-SEM). X-ray photoelectron spectroscopy (XPS) measurements were performed with a monochromatic Al Kα X-ray source. The survey spectra were measured using a pass energy of 40 eV at a resolution of 0.2 eV step$^{-1}$ and a total integration time of 0.1 s point$^{-1}$. The core level spectra were measured using a pass energy of 20 eV at a resolution of 0.05 eV step$^{-1}$ and a total integration time of 0.5 s point$^{-1}$. Deconvolution was performed using CasaXPS software with a Shirley-type background and 70-30 Gaussian-Lorentzian peak shapes. Charge referencing was initially performed using adventitious carbon at 284.8 eV. The S $2p_{3/2}$ peak position for $PS_4^{3-}$ species in uncoated material (161.5 eV) was subsequently used to enable self-consistent charge referencing, in particular after Li exposure. Scanning transmission electron microscopy (STEM) and Energy-Dispersive X-ray Spectroscopy (EDS) was performed on a TEM/STEM equipped with an EDS detector operated at 200 kV. The specimens were prepared by depositing powder onto a lacey-carbon-coated TEM grids inside an Argon-filled glovebox. All grids were transferred to the TEM under argon. The electron beam was carefully tuned to minimize any electron-beam-induced damage to the materials. The mass gain was collected on a thermogravimetric analyzer (TGA) under a flow of $O_2$, as well as under a flow of $O_2$ bubbled through deionized $H_2O$ to create humidified $H_2O$.

Electrochemical Measurements. For electrochemical measurements, the powder samples were cold pressed at 700 MPa to dense pellets (>95%) with Al/C on each side of the pellet as blocking electrodes. The thicknesses of the pellets range from 600-750 μm and the diameter of the pellets are 12.7 mm. In order to protect the argyrodite powder from the stainless-steel and/or PEEK pressing die for complementary XPS measurements, a Celgard separator was used. Electrochemical impedance spectroscopy (EIS) measurements were completed with a frequency range between 7 MHz-1 Hz under an applied amplitude of 100 mV. Arrhenius plots were collected between −20° C. and 100° C. Symmetric cells of Li||SSE||Li were assembled by using an air-tight, in-house-designed pressed cell (stack pressure: 6 MPa) and cycled at different current densities (0.05-0.75 mA cm$^{-2}$) in a forced air environmental chamber.

In an ALD process to coat primary particles of Li argyrodites, one starts by defining a coating composition and chooses appropriate gas-phase reactants to grow the desired chemistry. Alumina was chosen as the example coating chemistry for several reasons: 1) alumina ALD produces conformal films over a wide temperature range, 2) alumina alloys with Li metal anodes, 3) alumina is highly electronically insulating, and 4) pure alumina is stable under ambient conditions. Trimethyl aluminum (TMA) and $H_2O$ were chosen as the $Al_2O_3$ ALD precursors. The successful coating of the argyrodite powder without modifying the surface was uncertain given the moisture sensitivity of $Li_6PS_5Cl$ and the ability of TMA to reduce and etch materials. $Li_6PS_5Cl$ powder (1-10 grams) was evenly dispersed into a shallow stainless-steel tray and loaded into a glove box-integrated ALD reactor heated to 150° C. The reactor was then evacuated, and the powder was sequentially exposed to TMA and $H_2O$ vapors in each ALD alumina cycle. To understand the growth of ALD alumina on argyrodite powders, coatings were grown from 1, 10, and 100 cycles, producing ALD $Al_2O_3$ films of about 0.12, 1.2, and 12 nm thicknesses, respectively.

Figure 3A:
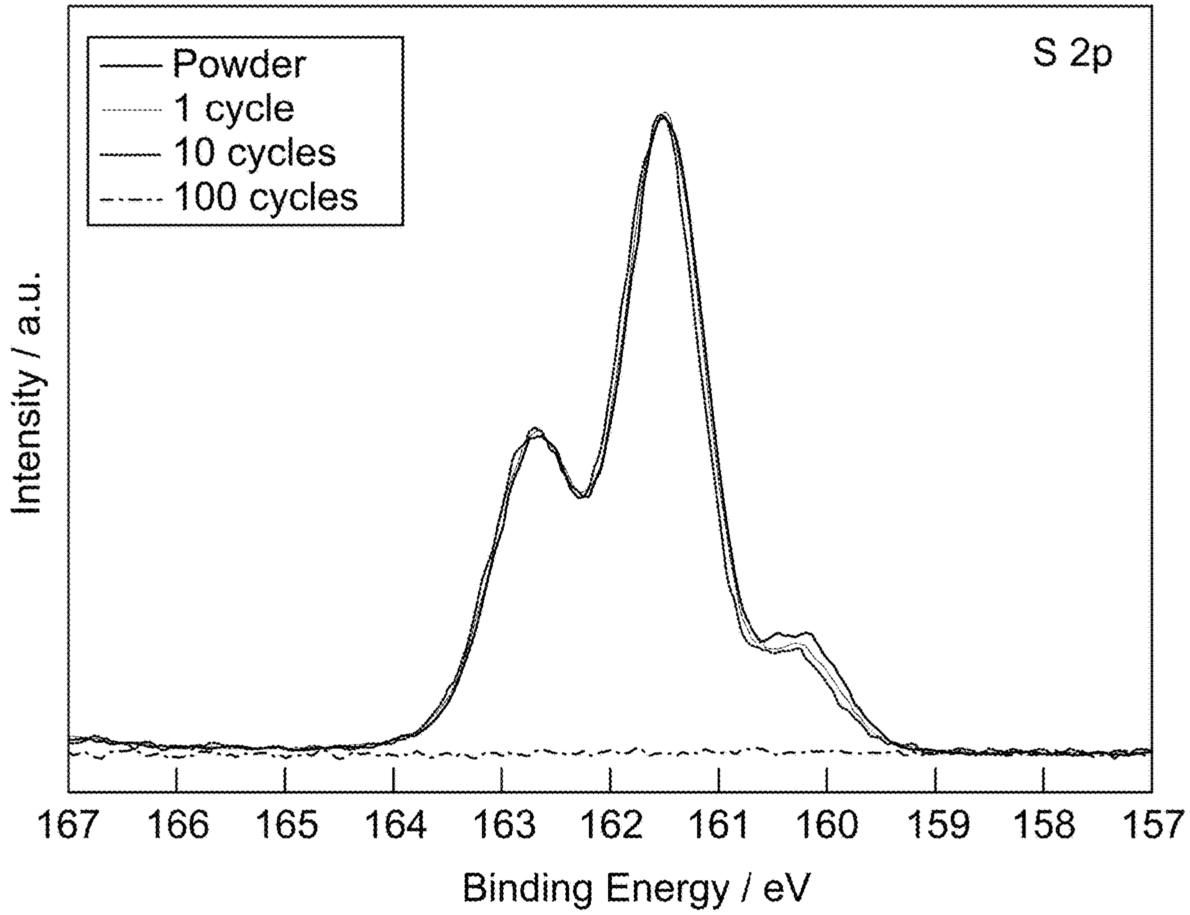
FIG. 3A is a graph of the S 2p peak in coated argyrodite powders as measured by X-ray photoelectron spectroscopy (XPS).
Figure 3B:
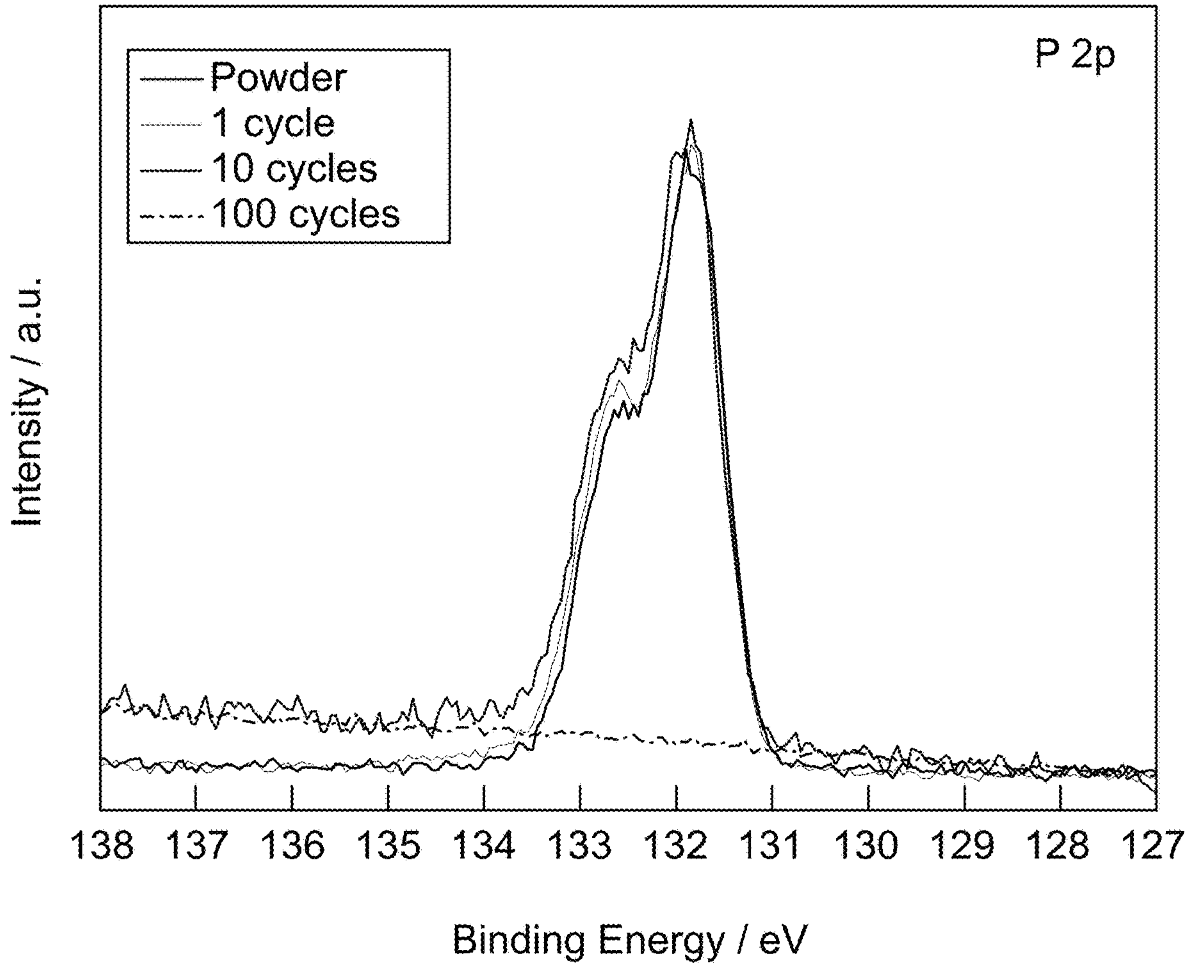
FIG. 3B is a graph of the P 2p peak in coated argyrodite powders as measured by XPS.
Figure 3C:
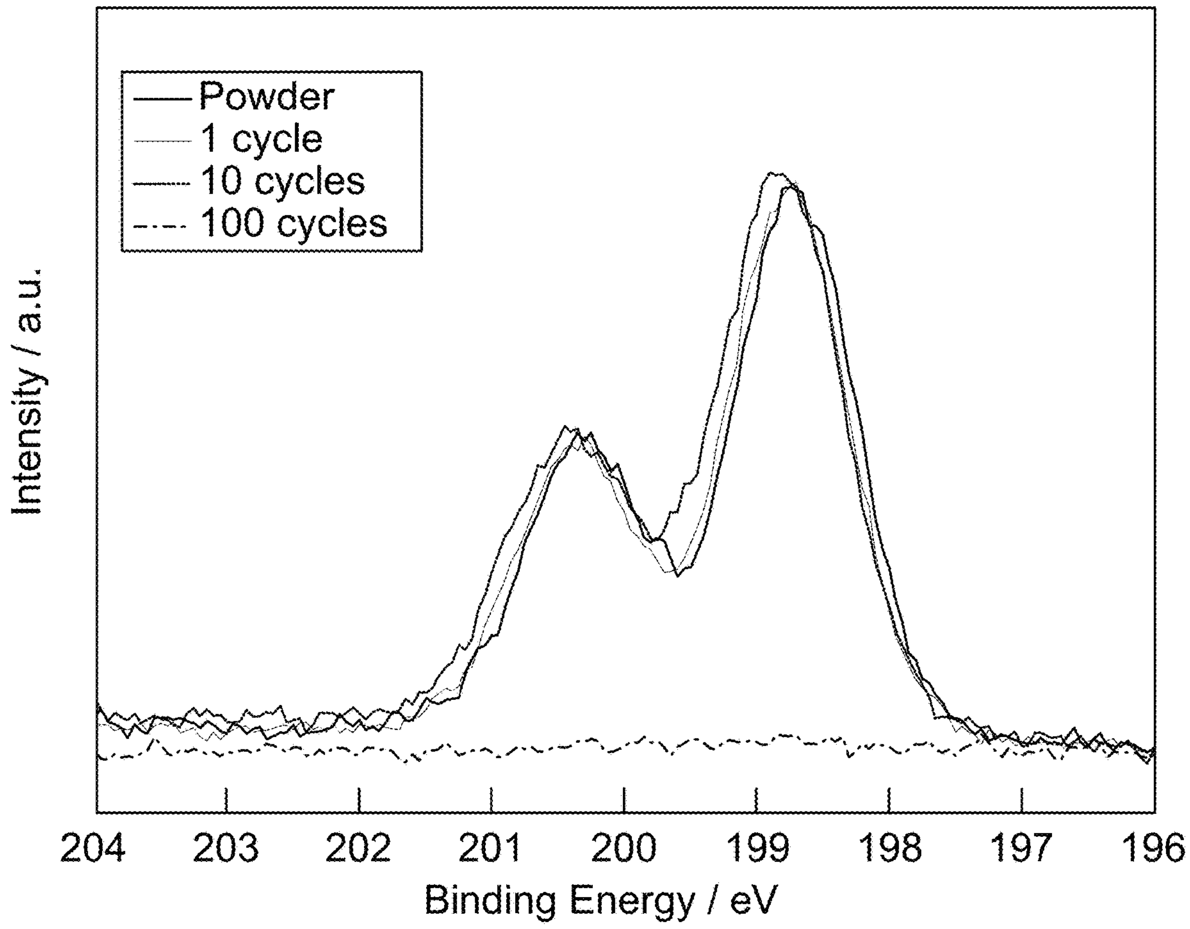
FIG. 3C is a graph of the Cl 2p peak in coated argyrodite powders as measured by XPS.

FIG. 3A is a graph of the S 2p peak in $Al_2O_3$-coated argyrodite powders as measured by X-ray photoelectron spectroscopy (XPS). FIG. 3B is a graph of the P 2p peak in $Al_2O_3$-coated argyrodite powders as measured by XPS. FIG. 3C is a graph of the Cl 2p peak in $Al_2O_3$-coated argyrodite powders as measured by XPS. XPS of coated powders indicated an increasing Al content with increasing number of ALD cycles, indicating the growth of $Al_2O_3$ films directly on LPSCl powders. Some oxygen content was observed, including on the uncoated materials, which may be the result of materials manufacturing/processing prior to these experiments (all materials were otherwise handled in glove box environments with <0.5 ppm $H_2O$ and $O_2$ content). Total surface oxygen concentration varied from 5% to 10% depending on the specific supplier of LPSCl. Speciation of the O1s region indicates that alumina layers on coated materials was primarily composed of Al—O and Al—OH bonding, together with the presence of minor organic/carbonate species on all materials. XPS analysis of the S 2p, P 2p, and Cl 2p core levels revealed little to no changes to the underlying SSE surface chemistry with increasing ALD cycles, indicating that, surprisingly, the TMA and $H_2O$ do not react significantly with LPSCl under these conditions. Additionally, the underlying LPSCl could not be probed due to the thickness of the alumina after 100 ALD cycles, further corroborating the formation of a conformal coating on the argyrodite powders. A small amount of $Li_2S$ formation was observed in the S 2p core level, which increased slightly with increasing number of ALD cycles. This may result from minor surface reduction of LPSCl by the TMA precursor, which is highly reducing and was the first species introduced during each ALD $Al_2O_3$ cycle. Surface passivation by $Li_2S$ may explain the chemical stability of the LPSCl powder when subsequently exposed to $H_2O$ vapor at 150° C., as LPSCl would otherwise be expected to oxidize significantly in humid atmospheres and such oxidation was not observed by XPS. Deconvolution of the Al 2p core level of coated materials further revealed the presence of a small amount of reduced Al species, consistent with a small amount of Li exchange between the SSE and the alumina layer.

High-angle annular dark field scanning transmission electron microscopy (HAADF-STEM) images and energy dispersive X-ray spectroscopy (EDS) indicated that the ALD alumina coatings deposited directly onto $Li_6PS_5Cl$ powders were uniform even after one ALD cycle, exhibiting an even distribution of the aluminum signal on the primary particles that was conformal at 10 and 100 cycles of ALD. After depositing ALD alumina on $Li_6PS_5Cl$, the relative particle size distribution was similar as indicated by SEM imaging, together with a similar irregular nano-/micro-scale structure that is typical for milled $Li_6PS_5Cl$.

Figure 4A:
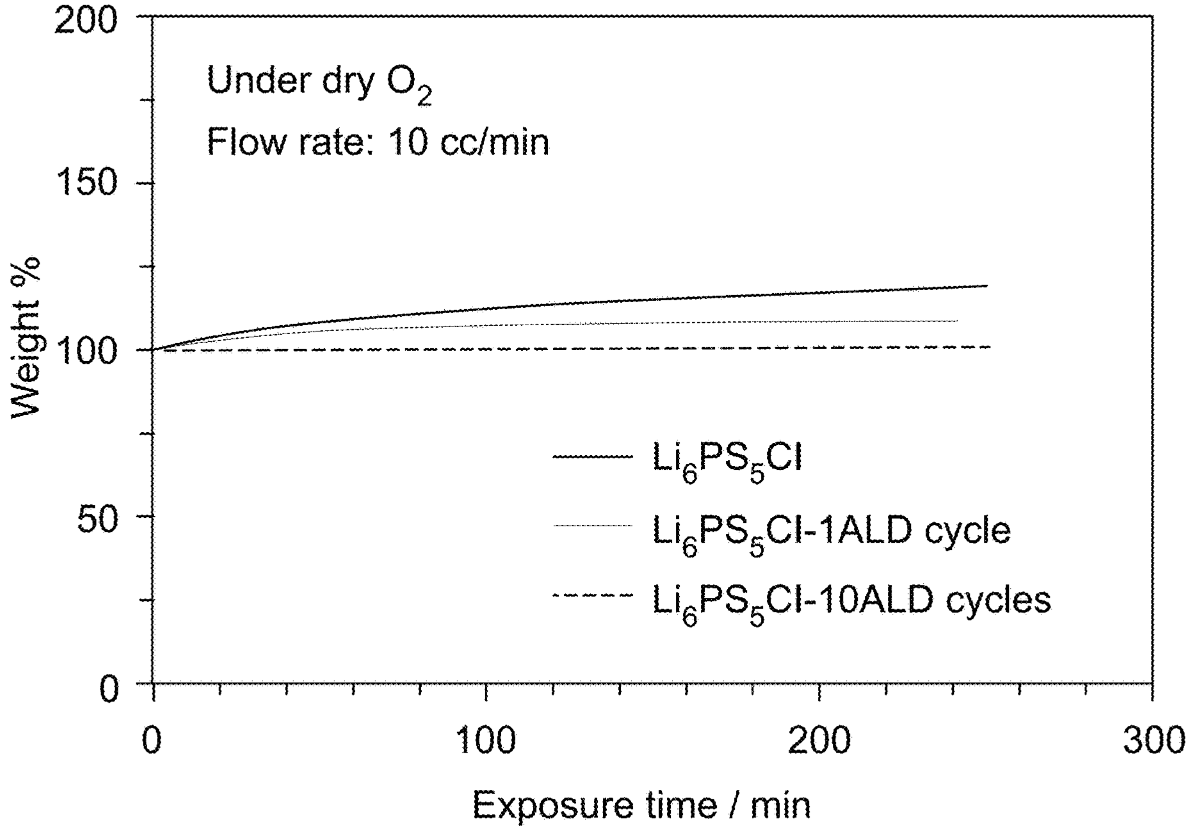
FIG. 4A is a graph of the mass change of argyrodite powders over time in flowing dry oxygen conditions.
Figure 4B:
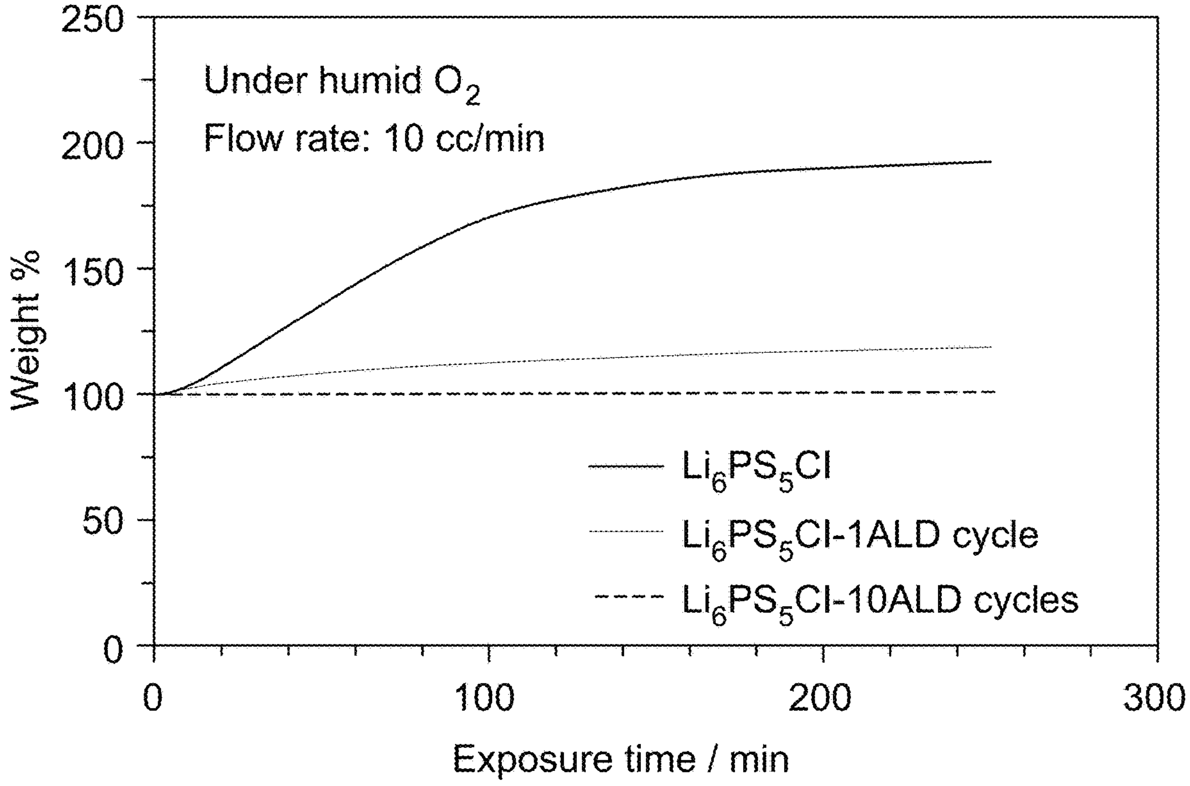
FIG. 4B is a graph of the mass change of argyrodite powders over time in flowing humid oxygen conditions.

FIG. 4A is a graph of the weight of argyrodite powders over time under flowing dry oxygen conditions. FIG. 4B is a graph of the weight of argyrodite powders over time under flowing humid oxygen conditions. Thermogravimetric analysis (TGA) was used to understand the impact of the ALD $Al_2O_3$ coatings on LPSCl when these electrolytes were subjected to oxidizing conditions. Specifically, the mass change of the powders was probed under a flow of dry and humidified $O_2$, as argyrodites and halide-based SSEs are known to be unstable under humid and oxidizing conditions. Mass gains for argyrodites under humid and oxidizing conditions can be correlated with the decomposition of the electrolyte into $H_2S$, Li sulfates, etc., in combination with $H_2O$ adsorption. The argyrodite powders coated with ALD $Al_2O_3$ showed significantly lower weight gain under dry and humidified $O_2$ exposure compared to the uncoated LPSCl. Specifically, argyrodite powders coated with 10 cycles of ALD $Al_2O_3$ exhibited negligible (≤1%) weight changes following 240 min of dry $O_2$ exposure, and only about 17% weight gain following 240 minutes of humid $O_2$ exposure. This compares to about 19% and about 100% weight gains for the uncoated argyrodite exposed to dry and humidified $O_2$, respectively. It is remarkable that even one ALD $Al_2O_3$ cycle may suppress the weight gain significantly under these conditions, in particular during humidified $O_2$ exposure. These results highlight that thin protection layers composed of alumina may significantly suppress the reactivity of the argyrodites under humid and oxidizing conditions.

Figure 5A:
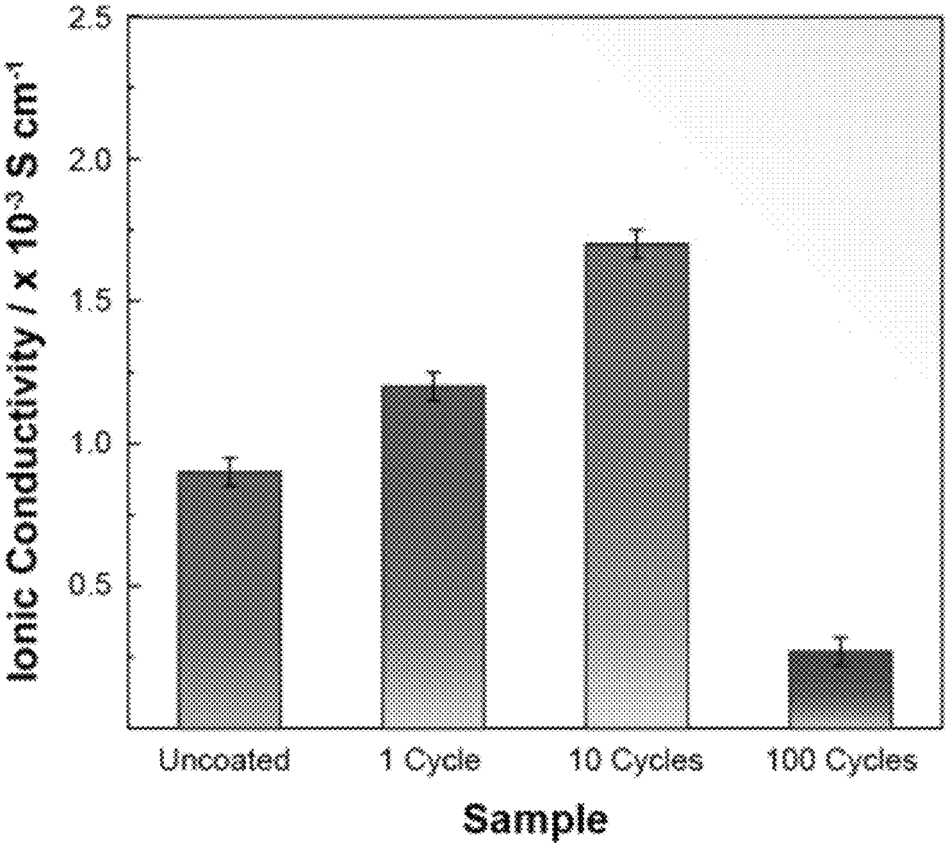
FIG. 5A is a graph of ionic conductivity of pellets formed from coated or uncoated argyrodite powders.
Figure 5B:
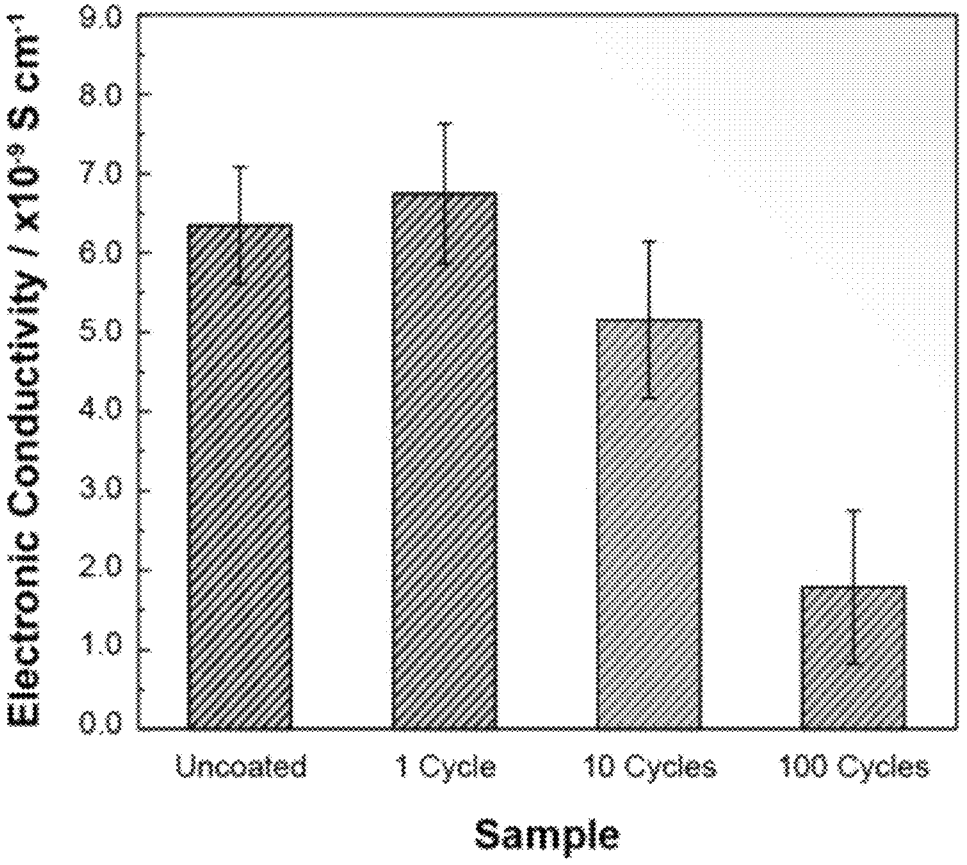
FIG. 5B is a graph of electronic conductivity of pellets formed from coated or uncoated argyrodite powders.

FIG. 5A is a graph of ionic conductivity of pellets formed from coated or uncoated argyrodite powders. FIG. 5B is a graph of electronic conductivity of pellets formed from coated or uncoated argyrodite powders.

To gain an understanding of the impact of the ALD alumina coatings on the electrochemical performance of the argyrodite, the ionic conductivity, Arrhenius activation energy, and electronic conductivity of pellets pressed from coated powders was evaluated. Electrochemical impedance spectroscopy (EIS) was used to measure the total ionic conductivity of pellets pressed from coated and uncoated argyrodite. The pristine argyrodite showed a $Li^+$ conductivity of $0.9\pm0.05\times 10^{-3}$ S $cm^{-1}$ at 25° C., together with an activation energy of 0.31±0.03 eV. Remarkably, pellets pressed from powders coated with 1 and 10 ALD $Al_2O_3$ cycles exhibited ionic conductivity values of $1.2\pm0.05\times10^{-3}$ S $cm^{-1}$ and $1.7\pm0.05\times10^{-3}$ S $cm^{-1}$ at 25° C., respectively, indicating that the ALD coatings resulted in up to a 2× increase in ionic conductivity relative to uncoated material. This increase in ionic conductivity was coupled with a slight decrease in the Arrhenius activation energy, to 0.30±0.02 eV for 1 ALD $Al_2O_3$ cycle and 0.28±0.02 eV for 10 ALD $Al_2O_3$ cycle. To further investigate the effect of thicker ALD coatings on the electrochemical performance, the ionic conductivity of pellets pressed from powders coated with 100 ALD alumina cycles was also evaluated. For these materials, the total ionic conductivity was measured to be $0.27\pm0.05\times 10^{-3}$ S $cm^{-1}$ at 25° C. with an activation energy of 0.29±0.02 eV. Without being bound by any theory, this drop in ionic conductivity may be due to the blocking effect of the ALD alumina on $Li^+$ transport across grain boundaries due to the low $Li^+$ conductivity of $Al_2O_3$.

Figure 6A:
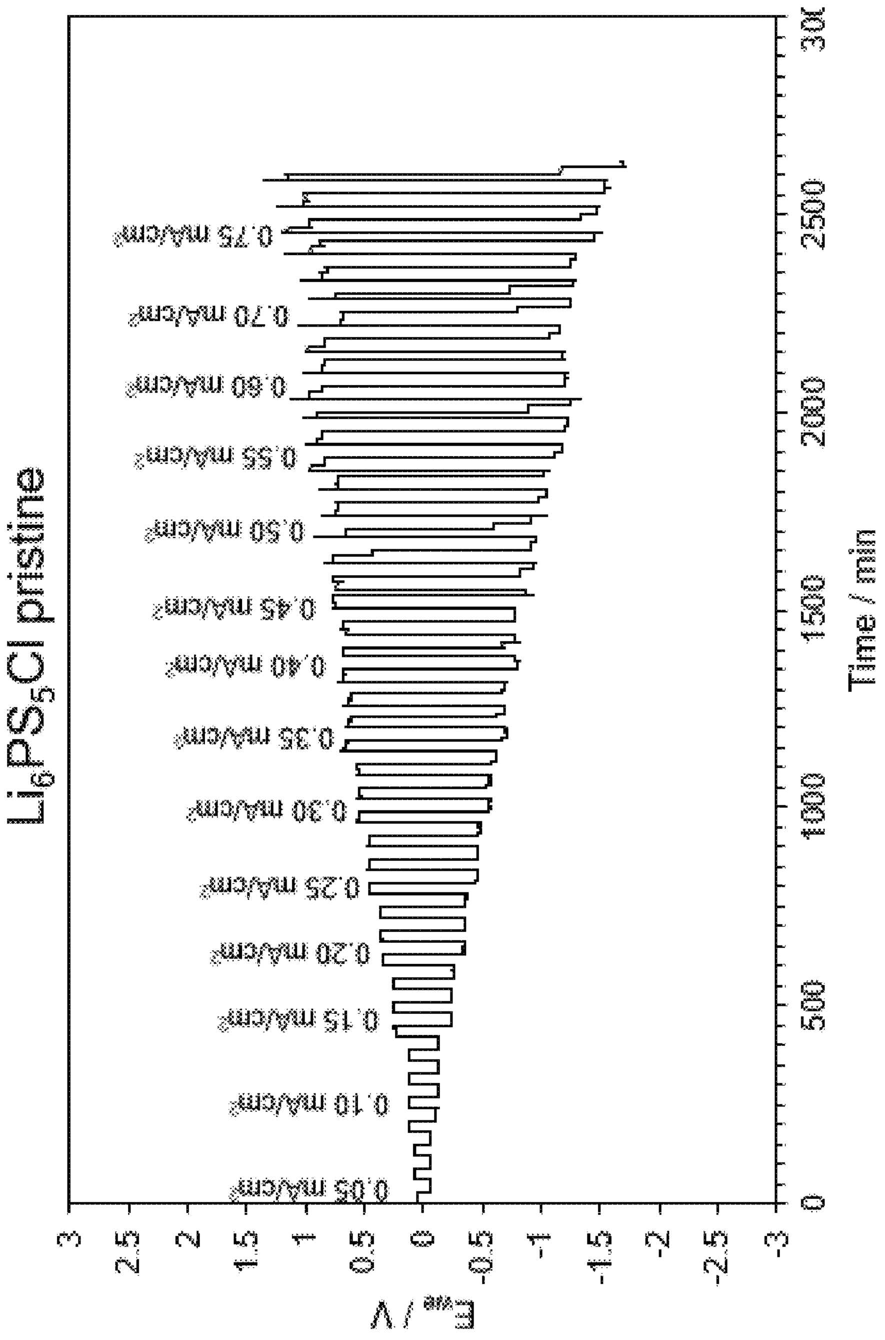
FIG. 6A is a graph of battery cycling of a SSB with an SSE formed from pristine $Li_6PS_5Cl$ powder.
Figure 6B:
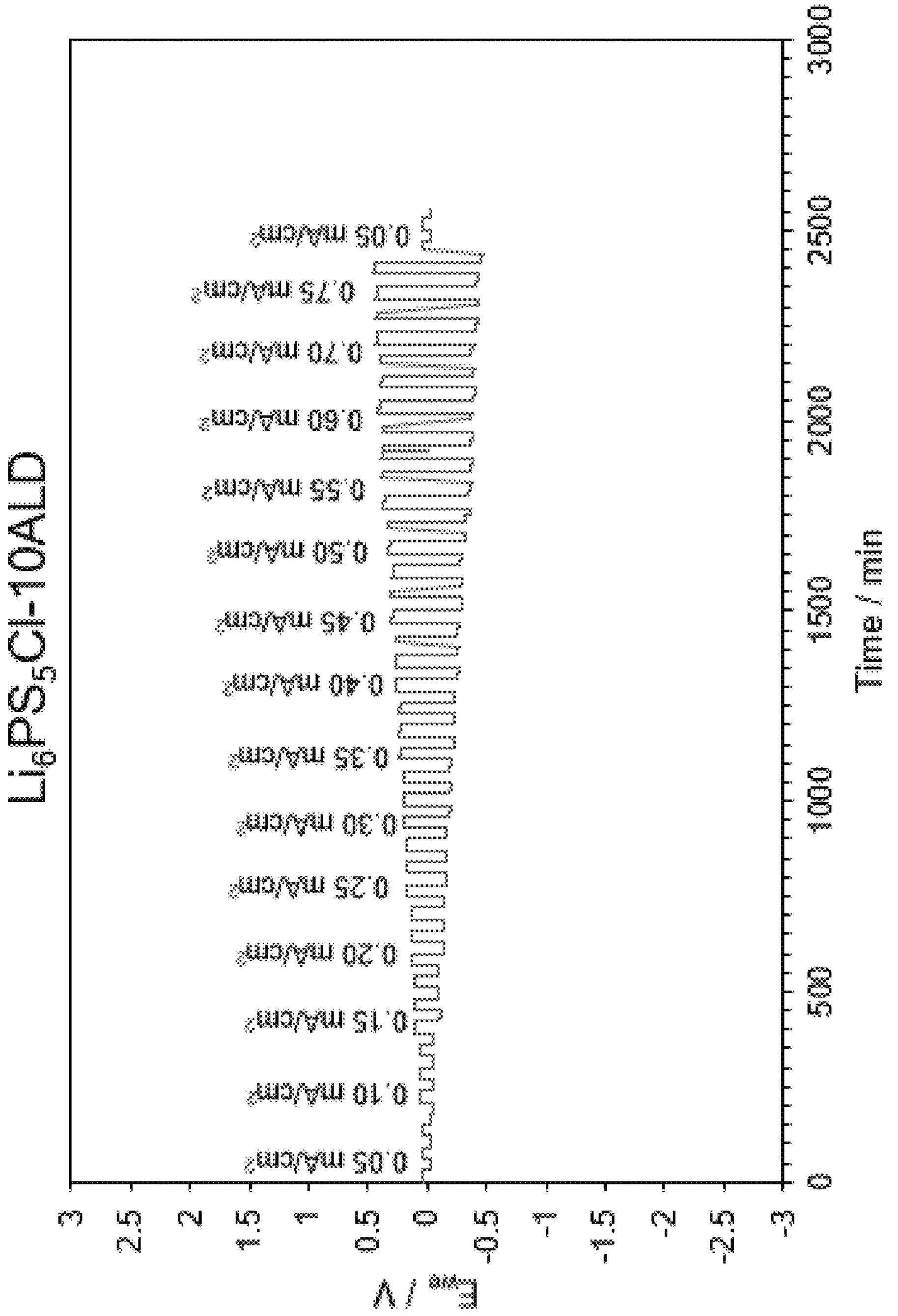
FIG. 6B is a graph of battery cycling of a SSB with an SSE formed from coated $Li_6PS_5Cl$ powder.

FIG. 6A is a graph of battery cycling of a SSB with an SSE formed from pristine $Li_6PS_5Cl$ powder. FIG. 6B is a graph of battery cycling of a SSB with an SSE formed from coated $Li_6PS_5Cl$ powder. The performance of pellets pressed from coated LPSCl powders towards Li metal plating and stripping as a function of cycle number was evaluated at constant current density (0.5 mA/$cm^2$) and varying current density and temperature (25° C.). The varied current densities were 0.05 $mA/cm^2$ to 0.75 $mA/cm^2$. At higher current densities, the pellets formed from uncoated LPSCl demonstrated polarization and instability. In contrast, the pellets formed from LPSCl coated with 10 cycles of ALD $Al_2O_3$ demonstrated stable cycling at 0.75 $mA/cm^2$.

Under constant current, uncoated LPSCl demonstrated uniform stripping and plating up to about 115 cycles, together with an increase in the DC polarization of nearly 2×. At cycle 116, an overpotential was observed, indicative of non-uniform Li metal plating/stripping. This performance was compared to pellets formed from coated LPSCl with LPSCl coated with 10 cycles of ALD $Al_2O_3$ in order to evaluate the impact of the ALD $Al_2O_3$ coating on the symmetric cell performance. Using the same testing conditions, the coated LPSCl showed uniform plating and stripping to at least 150 cycles and a 2× lower DC polarization relative to uncoated material, indicating a significant enhancement in the Li||Li cycling performance. Without being bound by any theory, the improvement in polarization behavior may be attributed to the combination of enhanced ionic conductivity and decreased electronic conductivity of the coated SSE, while the improvement in cycle life may be attributed to better wetting at the Li-SSE interface due to the presence of the alloying, "lithiophilic" alumina layer.

Example 2

LPSCl powders were coated with ZnS, ZnO, or ZnS/ZnO via ALD. The powders were formed into pellets and electrochemical properties were measured.

Materials Synthesis. Materials synthesis was performed in the same manner as in Example 1. To deposit the zinc sulfide coating, the zinc precursor diethyl zinc (DEZ) and the sulfur precursor 100% $H_2S$ were sequentially pulsed into the ALD reactor. Zinc sulfide coatings were deposited with ten cycles of ALD cycles, where each cycle included a pulse of DEZ and a pulse of $H_2S$. To deposit the zinc oxide coating, ten cycles of the zinc precursor DEZ and the oxygen precursor deionized water were sequentially pulsed into the ALD reactor, where each cycle included a pulse of DEZ and a pulse of water vapor. To deposit the zinc oxysulfide film, the following precursors were pulsed sequentially: DEZ, $H_2S$, DEZ, water, where this sequence was a single supercycle. The supercycle was repeated 5 times to deposit the ZnS/ZnO film. Each precursor pulse was separated by an appropriate inert gas purge step to separate precursors.

Figure 7A:
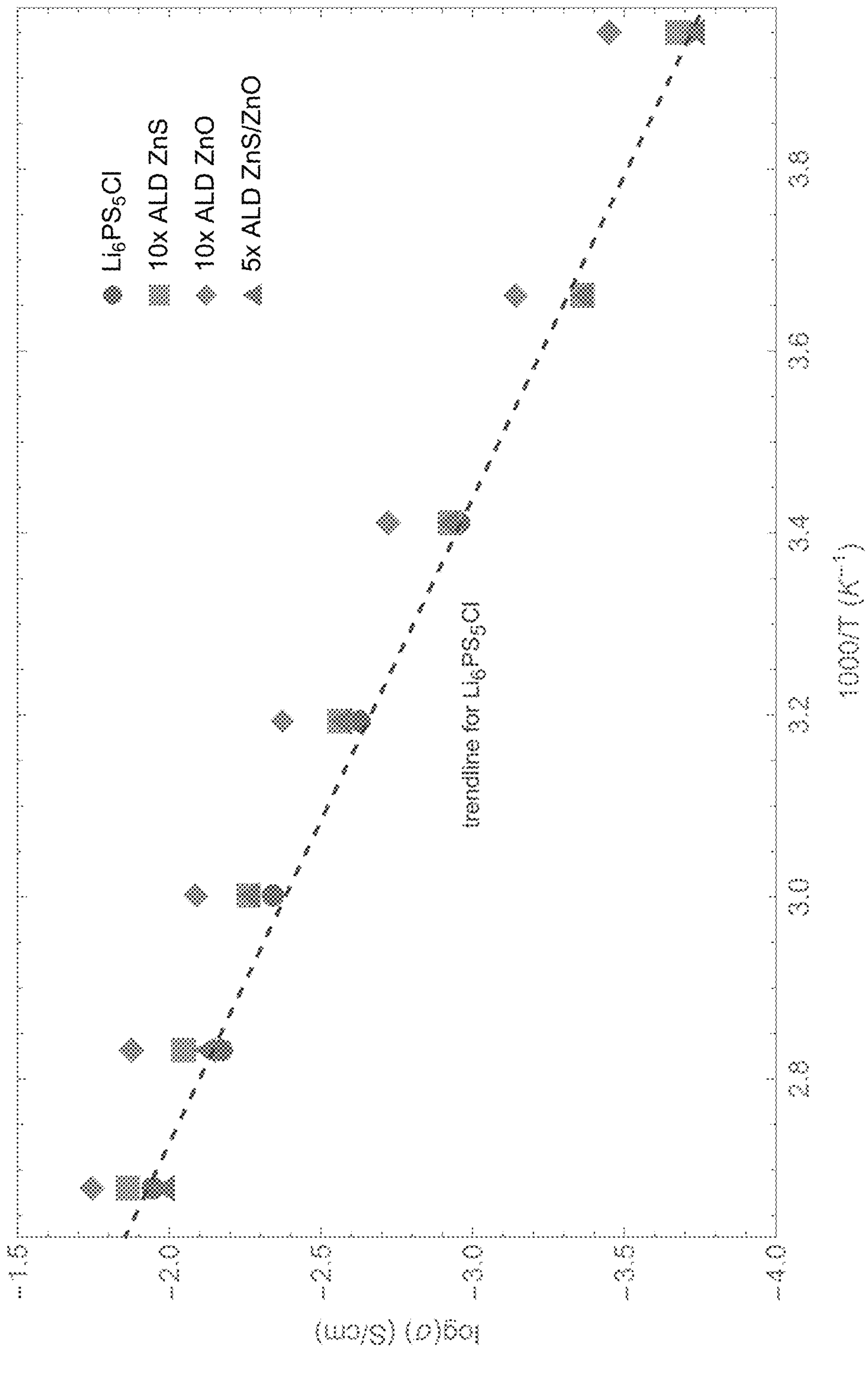
FIG. 7A is an Arrhenius graph of $Li^+$ conductivity of pellets formed from $Li_6PS_5Cl$ powder coated with ZnS, ZnO, or ZnS/ZnO.
Figure 7B:
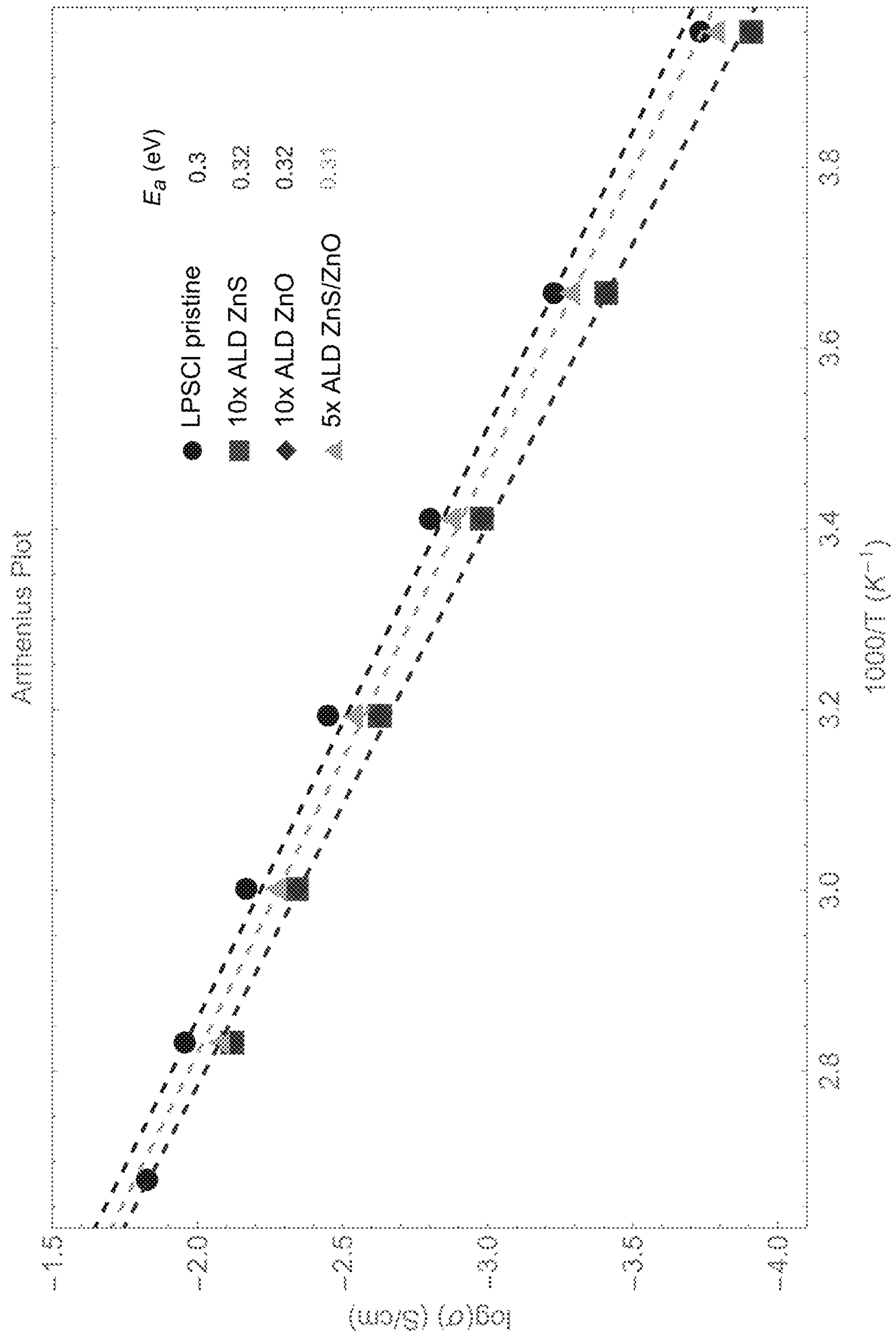
FIG. 7B is another Arrhenius graph of $Li^+$ conductivity of pellets formed from $Li_6PS_5Cl$ powder coated with ZnS, ZnO, or ZnS/ZnO.

FIG. 7A is an Arrhenius graph of $Li^+$ conductivity of pellets formed from LPSCl powders coated with ZnS, ZnO, or ZnS/ZnO. FIG. 7B is another Arrhenius graph of Lit conductivity of pellets formed from $Li_6PS_5Cl$ powder coated with ZnS, ZnO, or ZnS/ZnO. Measurements were taken at 20° C. The LPSCl pellets coated with ZnS, ZnO, and ZnS/ZnO had $Li^+$ conductivities in the same order of magnitude as the uncoated LPSCl. The LPSCl pellets coated with ZnS, ZnO, and ZnS/ZnO may maintain or slightly increase the bulk ionic conductivity of LPSCl.

Table 4 shows activation energy and electronic conductivity of the LPSCl pellets coated with ZnS, ZnO, or ZnS/ZnO. The LPSCl pellets made from LPSCl powders coated with ZnS, ZnO, or ZnS/ZnO had higher electronic conductivities than those from uncoated LPSCl.

TABLE 4

Activation Energy and Electronic Conductivity of Coated LPSCl

| Sample | Activation energy (eV) | Electronic conductivity (S/cm) at 20° C. |
|---|---|---|
| Uncoated LPSCl | 0.31 | $5.7 \times 10^{-10}$ |
| 10 cycles ALD ZnS | 0.29 | $1.1 \times 10^{-9}$ |
| 10 cycles ALD ZnO | 0.28 | $8.4 \times 10^{-10}$ |
| 5 cycles ALD ZnS/ZnO | 0.29 | $9.1 \times 10^{-10}$ |

Example 3

LPSCl powders were coated with lithiated aluminum oxide ($LiAlO_x$) via ALD. The powders were formed into pellets and electrochemical properties were measured.

Materials Synthesis. Materials synthesis was performed in the same manner as in Example 1. To deposit the $LiAlO_x$ coating, the lithium precursor lithium t-butoxide (Li-tbox), the aluminum precursor TMA, and the oxygen-source precursor water were sequentially pulsed into the ALD reactor for 5 or 50 cycles to deposit $LiAlO_x$ coatings on the LPSCl powder of different thicknesses. Each precursor pulse was separated by an appropriate Ar purge step to separate precursors. The $LiAlO_x$ ALD may be performed using supercycles of m cycles of pulses of Li-tbox and $H_2O$) and n cycles of pulses of TMA and $H_2O$. The $LiAlO_x$ ALD may be performed using sequential pulses of the three precursors Li t-box, $H_2O$, and TMA. By changing the dosing profile, it is possible to control the elemental ratio of Li:Al in the composite thin film coating. The Li:Al ratio is also dependent on the ALD processing temperature.

Figure 8:
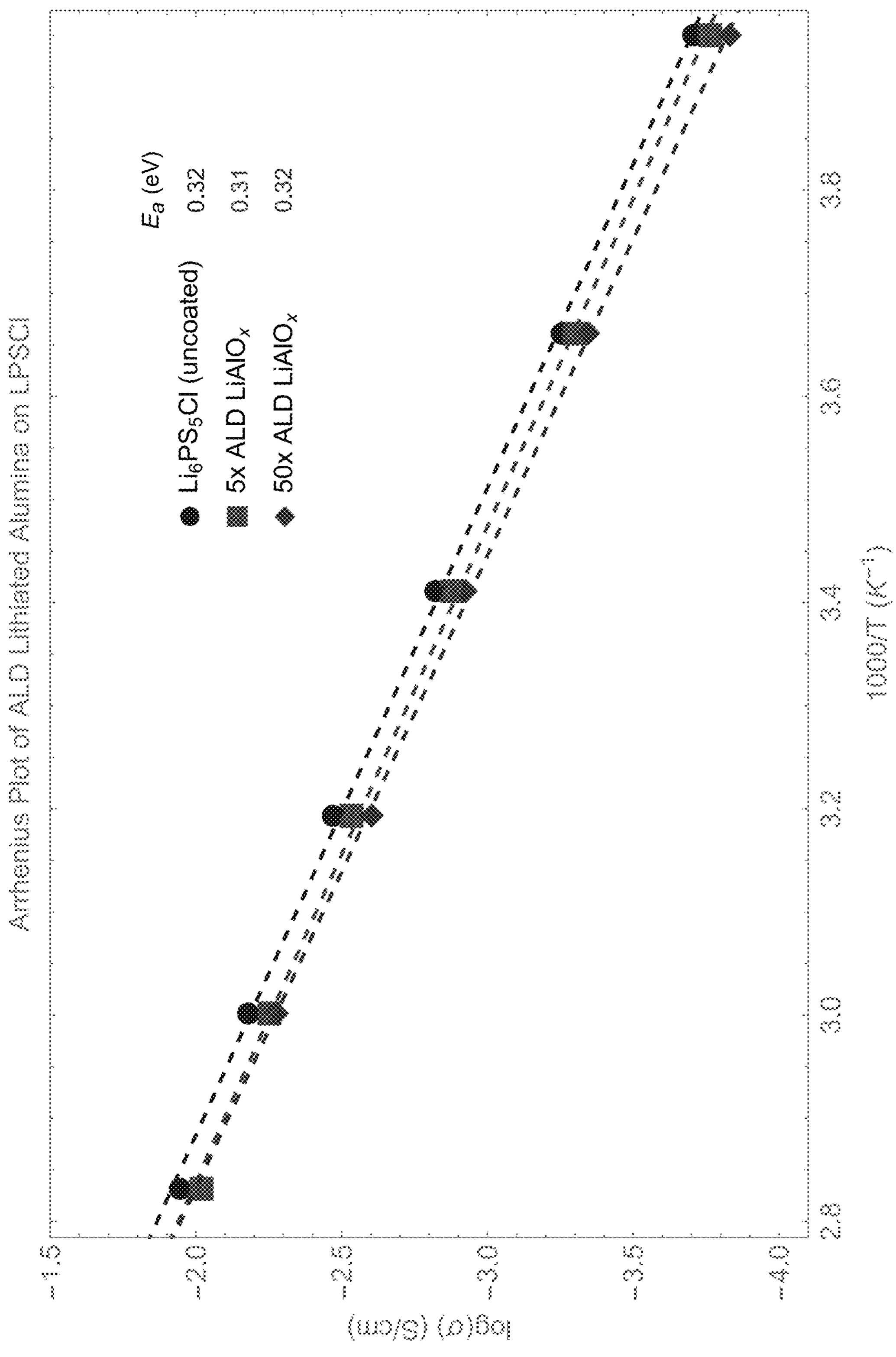
FIG. 8 is an Arrhenius graph of $Li^+$ conductivity of pellets formed from $Li_6PS_5Cl$ powder coated with lithiated aluminum oxide.

FIG. 8 is an Arrhenius graph of $Li^+$ conductivity of pellets formed from LPSCl powder coated with lithiated aluminum oxide as compared to pellets formed from uncoated LPSCl powder. The pellets formed from LPSCl powder coated with $LiAlO_x$ had ionic conductivity substantially similar to pellets formed from uncoated LPSCl powder. Compared to LPSCl coated with $Al_2O_3$, the LPSCl coated with 50 cycles of $LiAlO_x$ had a significantly higher ionic conductivity. Specifically, the $LiAlO_x$-coated LPSCl pellet had an ionic conductivity about a 4× higher than the $Al_2O_3$-coated LPSCl pellet. Specifically, the $Al_2O_3$-coated LPSCl had up to a 2× increase in ionic conductivity, while the $LiAlO_x$-coated LPSCl had up to a 1.5× increase in ionic conductivity when compared to the baseline uncoated LPSCl material.

Example 4

LPSCl powders were coated with magnesium oxide (MgO) via ALD. The powders were formed into pellets and electrochemical properties were measured.

Materials Synthesis. Materials synthesis was performed in the same manner as in Example 1. To deposit the MgO coating, the magnesium precursor bis(cyclopentadienyl) magnesium and the oxygen-source precursor water were sequentially pulsed into the ALD reactor 1 to 50 times to deposit MgO coatings on the LPSCl powder of different thicknesses. Each precursor pulse was separated by an appropriate purge step to separate precursors.

Figure 9:
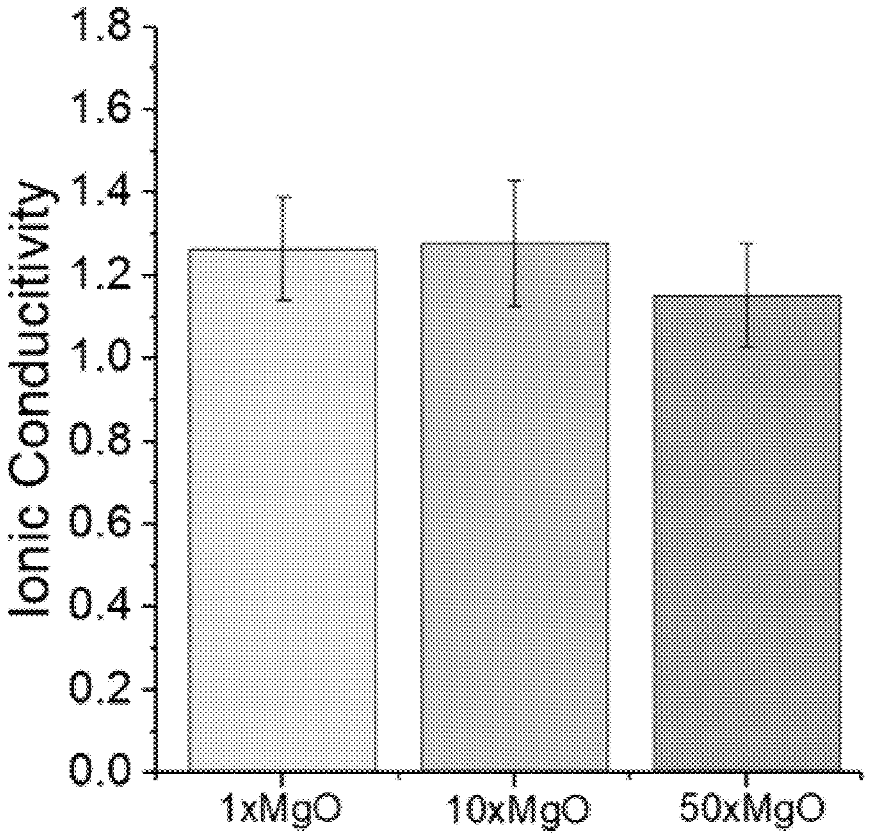
FIG. 9 is a graph of ionic conductivity of pellets formed from $Li_6PS_5Cl$ powder coated with MgO.

FIG. 9 is a graph of ionic conductivity of pellets formed from LPSCl powder coated with MgO. While the pellets with MgO coatings had slightly lower ionic conductivity than pellets formed from uncoated LPSCl powder, the pellets still maintained an acceptably high ionic conductivity. Specifically, the pellets formed from LPSCl powder coated with 1, 10, or 50 ALD cycles of MgO had an ionic conductivity of about 0.9 mS $cm^{-1}$ to about 1.4 mS $cm^{-1}$.

Example 5

Figure 10:
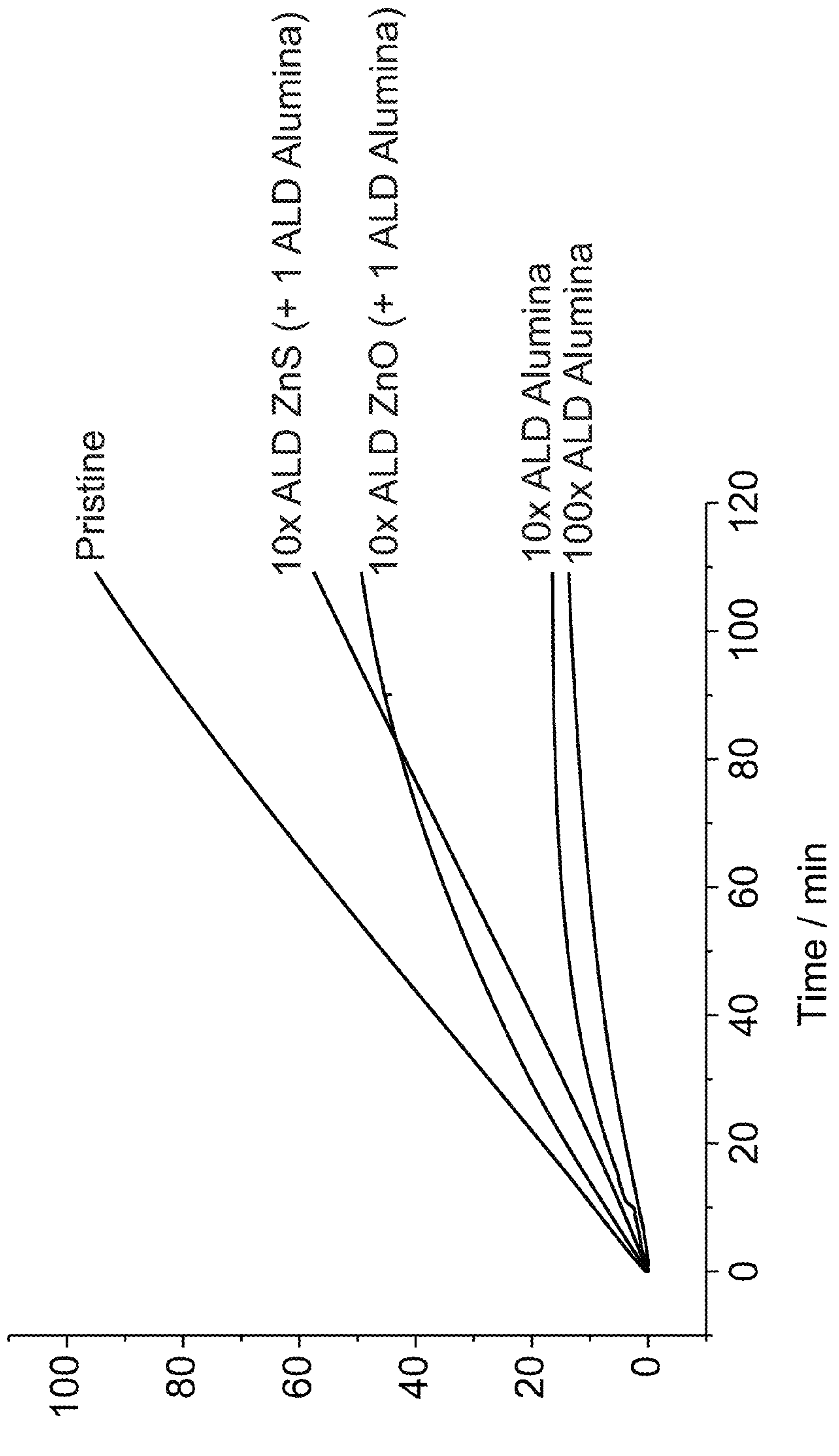
FIG. 10 is a graph of the weight over time of argyrodite powders with different coatings under flowing humid oxygen conditions.

FIG. 10 is a graph of the weight over time of argyrodite powders with different coatings under flowing humid oxygen conditions. To gain an understanding of the impact of the ZnS, ZnO, and $Al_2O_3$ coatings on the susceptibility of argyrodite powders to degradation in humidified oxygen, experiments were conducted to measure the mass change of argyrodite powders under flowing humid oxygen conditions. TGA was used for mass change measurements. The argyrodite powders coated with ALD $Al_2O_3$, ZnO, and ZnS showed significantly lower weight gain under humidified $O_2$ exposure compared to the uncoated LPSCl. Specifically, argyrodite powders coated with 10 or 100 cycles of ALD $Al_2O_3$ exhibited less than 20% weight change following 120 minutes of humid $O_2$ exposure. Argyrodite powders coated with 10 cycles of ZnS (with 1 cycle of $Al_2O_3$ as a seed layer) and 10 cycles of ZnO (with 1 cycle of $Al_2O_3$ as a seed layer) demonstrated a weight gain of about 40%-60%. In comparison, the uncoated argyrodite powder demonstrated a weight gain of more than 90% in the same conditions. These results highlight that thin protection layers composed of alumina, zinc oxide, or zinc sulfide may significantly suppress the reactivity of the argyrodites under humid and oxidizing conditions.

While certain embodiments have been illustrated and described, it should be understood that changes and modifications can be made therein in accordance with ordinary skill in the art without departing from the technology in its broader aspects as defined in the following claims.

The embodiments, illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase "consisting essentially of" will be understood to include those elements specifically recited and those additional elements that do not materially affect the basic and novel characteristics of the claimed technology. The phrase "consisting of" excludes any element not specified.

The present disclosure is not to be limited in terms of the particular embodiments described in this application. Many modifications and variations can be made without departing from its spirit and scope, as will be apparent to those skilled in the art. Functionally equivalent methods and compositions within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions, or biological systems, which can of course vary. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member.

All publications, patent applications, issued patents, and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

Other embodiments are set forth in the following claims.

What is claimed is:

1. A method comprising:

providing within an atomic layer deposition (ALD) reactor a lithium argyrodite powder of formula $Li_6PS_5Cl$;

depositing a first coating on the lithium argyrodite powder by an ALD process to form a coated lithium argyrodite powder, the depositing including:

(A) introducing a first precursor gas into the ALD reactor to form first precursor complexes on surfaces of the lithium argyrodite powder;

(B) introducing a first co-reactant into the ALD reactor, the first co-reactant reactive with the first precursor complexes; and forming the coated lithium argyrodite powder into a pellet, membrane, or film;

wherein the pellet, membrane, or film of the lithium argyrodite powder with the first coating has an ionic conductivity of about 0.25 mS $cm^{-1}$ to about 25 mS $cm^{-1}$ and an electronic conductivity of about $10^{-12}$ S $cm^{-1}$ to $10^{-7}$ S $cm^{-1}$.

2. The method of claim 1, wherein the first precursor gas comprises aluminum, zinc, magnesium, zirconium, titanium, yttrium, silicon, lithium, or niobium.

3. The method of claim 1, wherein the first co-reactant is selected from oxygen, ozone, hydrogen peroxide, water, hydrogen sulfide, dimethyl sulfide, ammonia, hydrazine, dimethyl hydrazine, hydrogen fluoride, hydrogen fluoride pyridine, trimethyl phosphate, trimethyl phosphite, sulfur tetrafluoride, and sulfur hexafluoride.

4. The method of claim 1, wherein depositing the first coating further includes:

repeating step (A); and (C) introducing a second co-reactant into the ALD reactor, the second co-reactant reactive with the first precursor complex and different from the first co-reactant.

5. The method of claim 4, wherein the first co-reactant is selected from oxygen, ozone, hydrogen peroxide and water, or a mixture of any two or more thereof;

wherein the second co-reactant is selected from $H_2S$ and dimethyl sulfide; and wherein the first coating comprises an oxysulfide.

6. The method of claim 5, wherein depositing the first coating further includes repeating steps (A) and (B) a plurality of times interspersed with repeating steps (A) and (C) a plurality of times, wherein a ratio of a number of steps (A) and (B) to a number of steps (A) and (C) is varied over the depositing so that the first coating comprises a graded oxysulfide composition over the first coating's thickness.

7. The method of claim 1, wherein depositing the first coating comprises repeating steps (A) and (B) until a thickness of the coating is about 0.1 nm to about 15 nm.

8. The method of claim 7, further comprising depositing a second coating on the first coating, the second coating different than the first coating and having a thickness of about 0.1 nm to about 15 nm.

9. The method of claim 1, wherein the lithium argyrodite powder comprises lithium argyrodite particles having a diameter of about 25 nm to about 20 μm.

10. The method of claim 1, wherein depositing the first coating comprises:

prior to step (A), depositing a seed coating comprising $Al_2O_3$ on the lithium argyrodite powder.

11. A method comprising:

providing within an atomic layer deposition (ALD) reactor a lithium argyrodite powder of formula $Li_{7-x}BCh_{6-x}X_x$, where $0<x\leq 1$, B is phosphorous or arsenic, Ch is sulfur or selenium, and X is F, Cl, Br, I, or a mixture of any two or more thereof;

depositing a first coating on the lithium argyrodite powder by an ALD process to form a coated lithium argyrodite powder, the depositing including:

(A) introducing a first precursor gas into the ALD reactor to form first precursor complexes on surfaces of the lithium argyrodite powder;

(B) introducing a first co-reactant into the ALD reactor, the first co-reactant reactive with the first precursor complexes repeating step (A); and (C) introducing a second co-reactant into the ALD reactor, the second co-reactant reactive with the first precursor complex and different from the first co-reactant, wherein the first co-reactant is selected from oxygen, ozone, hydrogen peroxide and water, or a mixture of any two or more thereof;

wherein the second co-reactant is selected from $H_2S$ and dimethyl sulfide; and wherein the first coating comprises an oxysulfide.

12. The method of claim 11, wherein the first precursor gas comprises aluminum, zinc, magnesium, zirconium, titanium, yttrium, silicon, lithium, or niobium.

13. The method of claim 11, wherein depositing the first coating further includes repeating steps (A) and (B) a plurality of times interspersed with repeating steps (A) and (C) a plurality of times, wherein a ratio of a number of steps (A) and (B) to a number of steps (A) and (C) is varied over the depositing so that the first coating comprises a graded oxysulfide composition over the first coating's thickness.

14. The method of claim 11, wherein depositing the first coating comprises repeating steps (A) and (B) until a thickness of the coating is about 0.1 nm to about 15 nm.

15. The method of claim 11, wherein the lithium argyrodite powder comprises lithium argyrodite particles having a diameter of about 25 nm to about 20 μm.

16. The method of claim 11, wherein depositing the first coating comprises:

prior to step (A), depositing a seed coating comprising $Al_2O_3$ on the lithium argyrodite powder.

* * * * *